(12) United States Patent
Harris et al.

(10) Patent No.: US 12,367,412 B2
(45) Date of Patent: Jul. 22, 2025

(54) SYSTEMS AND METHODS FOR FABRICATING FLUX TRAP MITIGATING SUPERCONDUCTING INTEGRATED CIRCUITS

(71) Applicant: D-WAVE SYSTEMS INC., Burnaby (CA)

(72) Inventors: Richard G. Harris, North Vancouver (CA); Christopher B. Rich, Vancouver (CA)

(73) Assignee: 1372934 B.C. LTD., Burnaby (CA)

( * ) Notice: Subject to any disclaimer, the term of this patent is extended or adjusted under 35 U.S.C. 154(b) by 421 days.

(21) Appl. No.: 17/782,261

(22) PCT Filed: Dec. 3, 2020

(86) PCT No.: PCT/US2020/063113
§ 371 (c)(1),
(2) Date: Jun. 3, 2022

(87) PCT Pub. No.: WO2021/113513
PCT Pub. Date: Jun. 10, 2021

(65) Prior Publication Data
US 2023/0004851 A1    Jan. 5, 2023

Related U.S. Application Data

(60) Provisional application No. 62/944,143, filed on Dec. 5, 2019.

(51) Int. Cl.
*H10N 60/80* (2023.01)
*G06N 10/40* (2022.01)
*H10N 60/01* (2023.01)

(52) U.S. Cl.
CPC ......... *G06N 10/40* (2022.01); *H10N 60/0912* (2023.02); *H10N 60/805* (2023.02)

(58) Field of Classification Search
CPC ........ G06N 10/40; G06N 10/20; G06N 10/60; H10N 60/0912; H10N 60/805; H10N 69/00
(Continued)

(56) References Cited

U.S. PATENT DOCUMENTS 4,009,479 A   2/1977   Cardinne et al.
4,028,714 A   6/1977   Henkels
(Continued)

FOREIGN PATENT DOCUMENTS

CN    1471180 A    1/2004
CN    101088102 A   12/2007
(Continued)

OTHER PUBLICATIONS

Barends, et al., "Superconducting quantum circuits at the surface code threshold for fault tolerance", Nature vol. 508, pp. 500-503 (2014).
(Continued)

*Primary Examiner* — Duy T Nguyen
(74) *Attorney, Agent, or Firm* — Cozen O'Connor

(57) ABSTRACT

A system and method for mitigating flux trapping in a superconducting integrated circuit. A first metal layer is formed having a first critical temperature and a first device, and a flux directing layer is formed having a second critical temperature. The flux directing layer is positioned in communication with an aperture location, and the aperture location is spaced from the first device to isolate the first device from flux trapped in the aperture. The superconducting integrated circuit is cooled from a first temperature that is above both the first and second critical temperatures to a second temperature that is less than both the first and second critical temperatures by a cryogenic refrigerator. A relative temperature difference between the first and second critical
(Continued)

temperatures causes the flux directing layer to direct flux away from the first device and trap flux at the aperture location.

20 Claims, 10 Drawing Sheets

(58) Field of Classification Search
USPC .......................................................... 257/31
See application file for complete search history.

(56) References Cited

U.S. PATENT DOCUMENTS

| | | | |
|---|---|---|---|
| 4,454,522 A | | 6/1984 | De |
| 4,490,733 A | | 12/1984 | Kroger |
| 4,554,567 A | | 11/1985 | Jillie et al. |
| 4,689,559 A | | 8/1987 | Hastings et al. |
| 4,749,888 A | | 6/1988 | Sakai et al. |
| 4,912,975 A | | 4/1990 | Ohta et al. |
| 5,055,158 A | | 10/1991 | Gallagher et al. |
| 5,084,438 A | | 1/1992 | Matsubara et al. |
| 5,087,605 A | | 2/1992 | Hegde et al. |
| 5,131,976 A | | 7/1992 | Hoko |
| 5,157,466 A | * | 10/1992 | Char .................. H10N 60/0941 356/333 |
| 5,164,696 A | | 11/1992 | Kotani |
| 5,218,297 A | * | 6/1993 | Nakane .............. G01R 33/0358 505/846 |
| 5,250,817 A | | 10/1993 | Fink |
| 5,274,249 A | | 12/1993 | Xi et al. |
| 5,290,761 A | | 3/1994 | Keating et al. |
| 5,307,068 A | | 4/1994 | Hartemann |
| 5,323,344 A | | 6/1994 | Katayama et al. |
| 5,323,520 A | | 6/1994 | Peters et al. |
| 5,339,457 A | | 8/1994 | Kawasaki et al. |
| 5,358,928 A | | 10/1994 | Ginley et al. |
| 5,514,974 A | | 5/1996 | Bouldin |
| 5,548,130 A | | 8/1996 | Shimizu et al. |
| 5,627,139 A | | 5/1997 | Chin et al. |
| 5,672,212 A | | 9/1997 | Manos |
| 5,767,043 A | | 6/1998 | Cantor et al. |
| 5,776,863 A | | 7/1998 | Silver |
| 5,804,251 A | | 9/1998 | Yu et al. |
| 5,846,846 A | | 12/1998 | Suh et al. |
| 5,854,492 A | * | 12/1998 | Chinone ............ G01R 33/0356 324/228 |
| 5,858,106 A | | 1/1999 | Ohmi et al. |
| 5,863,868 A | | 1/1999 | Chan et al. |
| 5,869,846 A | | 2/1999 | Higashino et al. |
| 5,880,069 A | | 3/1999 | Nakao et al. |
| 5,892,243 A | | 4/1999 | Chan |
| 5,962,865 A | | 10/1999 | Kerber et al. |
| 5,962,866 A | | 10/1999 | Diiorio et al. |
| 6,011,981 A | | 1/2000 | Alvarez et al. |
| 6,165,801 A | | 12/2000 | Burns et al. |
| 6,188,919 B1 | | 2/2001 | Lagraff et al. |
| 6,242,387 B1 | | 6/2001 | Cukauskas et al. |
| 6,284,721 B1 | | 9/2001 | Lee |
| 6,362,638 B1 | | 3/2002 | Ashton et al. |
| 6,384,423 B1 | | 5/2002 | Kerber et al. |
| 6,384,424 B1 | | 5/2002 | Kugai et al. |
| 6,420,189 B1 | | 7/2002 | Lopatin |
| 6,459,097 B1 | | 10/2002 | Zagoskin |
| 6,476,413 B1 | | 11/2002 | Jia et al. |
| 6,495,854 B1 | | 12/2002 | Newns et al. |
| 6,517,944 B1 | | 2/2003 | Puzey et al. |
| 6,518,673 B2 | | 2/2003 | Herr et al. |
| 6,541,789 B1 | | 4/2003 | Sato et al. |
| 6,563,311 B2 | | 5/2003 | Zagoskin |
| 6,569,252 B1 | | 5/2003 | Sachdev et al. |
| 6,624,122 B1 | | 9/2003 | Holesinger et al. |
| 6,627,915 B1 | | 9/2003 | Ustinov et al. |
| 6,715,944 B2 | | 4/2004 | Oya et al. |
| 6,753,546 B2 | | 6/2004 | Tzalenchuk et al. |
| 6,767,840 B1 | | 7/2004 | Uehara et al. |
| 6,803,599 B2 | | 10/2004 | Amin et al. |
| 6,838,694 B2 | | 1/2005 | Esteve et al. |
| 6,882,293 B2 | | 4/2005 | Shoji et al. |
| 6,905,887 B2 | | 6/2005 | Amin et al. |
| 6,911,664 B2 | | 6/2005 | Il et al. |
| 6,936,808 B2 | | 8/2005 | Uchida |
| 6,979,836 B2 | | 12/2005 | Zagoskin et al. |
| 6,984,846 B2 | | 1/2006 | Newns et al. |
| 7,091,132 B2 | | 8/2006 | Tan et al. |
| 7,135,701 B2 | | 11/2006 | Amin et al. |
| 7,335,909 B2 | | 2/2008 | Amin et al. |
| 7,418,283 B2 | | 8/2008 | Amin |
| 7,432,705 B2 | | 10/2008 | Seki et al. |
| 7,533,068 B2 | | 5/2009 | Maassen et al. |
| 7,619,437 B2 | | 11/2009 | Thom et al. |
| 7,624,088 B2 | | 11/2009 | Johnson et al. |
| 7,638,434 B2 | | 12/2009 | Helneder |
| 7,639,035 B2 | | 12/2009 | Berkley |
| 7,675,139 B2 | | 3/2010 | Nomura et al. |
| 7,676,903 B1 | | 3/2010 | Weller et al. |
| 7,687,938 B2 | | 3/2010 | Bunyk et al. |
| 7,843,209 B2 | | 11/2010 | Berkley |
| 7,876,248 B2 | | 1/2011 | Berkley et al. |
| 7,898,282 B2 | | 3/2011 | Harris et al. |
| 7,981,759 B2 | | 7/2011 | Cervin-Lawry et al. |
| 7,990,662 B2 | | 8/2011 | Berkley et al. |
| 8,008,942 B2 | | 8/2011 | Van et al. |
| 8,018,244 B2 | | 9/2011 | Berkley |
| 8,035,540 B2 | | 10/2011 | Berkley et al. |
| 8,098,179 B2 | | 1/2012 | Bunyk et al. |
| 8,169,231 B2 | | 5/2012 | Berkley |
| 8,190,548 B2 | | 5/2012 | Choi |
| 8,195,596 B2 | | 6/2012 | Rose et al. |
| 8,264,305 B2 | | 9/2012 | Cisco |
| 8,283,943 B2 | | 10/2012 | Van Den Brink et al. |
| 8,301,214 B1 | | 10/2012 | Tolpygo et al. |
| 8,421,053 B2 | | 4/2013 | Bunyk et al. |
| 8,437,818 B1 | | 5/2013 | Tolpygo et al. |
| 8,441,330 B2 | | 5/2013 | Uchaykin |
| 8,536,566 B2 | | 9/2013 | Johansson et al. |
| 8,571,614 B1 | | 10/2013 | Mukhanov et al. |
| 8,611,974 B2 | | 12/2013 | Maibaum et al. |
| 8,644,898 B1 | * | 2/2014 | De Andrade ...... H10N 60/0828 505/220 |
| 8,742,594 B2 | | 6/2014 | Daubenspeck et al. |
| 8,854,074 B2 | | 10/2014 | Berkley |
| 8,933,695 B1 | | 1/2015 | Kornev et al. |
| 8,951,808 B2 | | 2/2015 | Ladizinsky et al. |
| 9,130,116 B1 | | 9/2015 | Tolpygo et al. |
| 9,136,457 B2 | | 9/2015 | Tolpygo |
| 9,183,508 B2 | | 11/2015 | King |
| 9,324,767 B1 | | 4/2016 | Steinbach et al. |
| 9,355,362 B2 | | 5/2016 | Shea et al. |
| 9,490,296 B2 | | 11/2016 | Ladizinsky et al. |
| 9,495,644 B2 | | 11/2016 | Chudak et al. |
| 9,520,180 B1 | | 12/2016 | Mukhanov et al. |
| 9,564,573 B1 | | 2/2017 | Chang et al. |
| 9,634,224 B2 | | 4/2017 | Ladizinsky et al. |
| 9,768,371 B2 | | 9/2017 | Ladizinsky et al. |
| 9,836,688 B2 | | 12/2017 | Dancausse et al. |
| 9,836,699 B1 | | 12/2017 | Rigetti et al. |
| 9,971,970 B1 | * | 5/2018 | Rigetti .................. H10N 69/00 |
| 9,978,809 B2 | | 5/2018 | Ladizinsky et al. |
| 10,134,972 B2 | | 11/2018 | Oliver et al. |
| 10,141,493 B2 | | 11/2018 | Tuckerman |
| 10,290,425 B2 | | 5/2019 | Shindo et al. |
| 10,424,711 B2 | | 9/2019 | Schoelkopf et al. |
| 10,454,015 B2 | | 10/2019 | Lanting et al. |
| 10,528,886 B2 | | 1/2020 | Boothby |
| 10,658,424 B2 | | 5/2020 | Oliver et al. |
| 10,938,346 B2 | | 3/2021 | Berkley et al. |
| 11,038,095 B2 | | 6/2021 | Huang et al. |
| 11,100,416 B2 | | 8/2021 | Lanting et al. |
| 11,105,866 B2 | | 8/2021 | Swenson et al. |
| 11,121,301 B1 | | 9/2021 | Marshall et al. |
| 11,127,893 B2 | | 9/2021 | Johnson et al. |
| 11,295,225 B2 | | 4/2022 | Hoskinson et al. |
| 11,436,516 B2 | | 9/2022 | Kelly et al. |
| 11,856,871 B2 | | 12/2023 | Lanting et al. |

(56) References Cited

U.S. PATENT DOCUMENTS

| | | |
|---|---|---|
| 2001/0020701 A1 | 9/2001 | Zagoskin |
| 2002/0017906 A1 | 2/2002 | Ho et al. |
| 2002/0117738 A1 | 8/2002 | Amin et al. |
| 2002/0180006 A1 | 12/2002 | Franz et al. |
| 2002/0188578 A1 | 12/2002 | Amin et al. |
| 2002/0190343 A1 | 12/2002 | Jones et al. |
| 2002/0190381 A1 | 12/2002 | Herr et al. |
| 2003/0027724 A1 | 2/2003 | Rose et al. |
| 2003/0038286 A1 | 2/2003 | Van et al. |
| 2003/0068832 A1 | 4/2003 | Koval et al. |
| 2003/0071258 A1* | 4/2003 | Zagoskin ............ H10N 60/124 380/278 |
| 2003/0089987 A1 | 5/2003 | Parikh |
| 2003/0102470 A1 | 6/2003 | Il et al. |
| 2003/0107033 A1 | 6/2003 | Tzalenchuk et al. |
| 2003/0218872 A1 | 11/2003 | Tsukada et al. |
| 2004/0077504 A1 | 4/2004 | Adachi et al. |
| 2004/0087081 A1 | 5/2004 | Aitchison et al. |
| 2004/0155237 A1 | 8/2004 | Kerber |
| 2004/0191697 A1 | 9/2004 | Nakatsuka et al. |
| 2004/0232912 A1 | 11/2004 | Tsukamoto et al. |
| 2004/0266209 A1 | 12/2004 | Hinode et al. |
| 2005/0029512 A1 | 2/2005 | Hato et al. |
| 2005/0062131 A1 | 3/2005 | Murduck et al. |
| 2005/0107261 A1 | 5/2005 | Cantor et al. |
| 2006/0197193 A1 | 9/2006 | Gu et al. |
| 2008/0001699 A1 | 1/2008 | Gardner et al. |
| 2008/0070325 A1 | 3/2008 | Tolpygo |
| 2008/0238531 A1 | 10/2008 | Harris |
| 2009/0033353 A1 | 2/2009 | Yu et al. |
| 2009/0078931 A1 | 3/2009 | Berkley |
| 2009/0203192 A1 | 8/2009 | Kaltalioglu et al. |
| 2009/0312186 A1 | 12/2009 | Norem et al. |
| 2009/0317958 A1 | 12/2009 | Tang et al. |
| 2009/0319757 A1 | 12/2009 | Berkley |
| 2010/0148853 A1* | 6/2010 | Harris .................... B82Y 10/00 327/528 |
| 2011/0022820 A1 | 1/2011 | Bunyk et al. |
| 2011/0065586 A1 | 3/2011 | Maibaum et al. |
| 2011/0089405 A1 | 4/2011 | Ladizinsky et al. |
| 2012/0319211 A1 | 12/2012 | Van Dal et al. |
| 2013/0029848 A1 | 1/2013 | Gonzalez et al. |
| 2013/0116159 A1 | 5/2013 | Pollard et al. |
| 2014/0111242 A1 | 4/2014 | Xie et al. |
| 2015/0032994 A1 | 1/2015 | Chudak et al. |
| 2015/0046681 A1 | 2/2015 | King |
| 2015/0119252 A1 | 4/2015 | Ladizinsky et al. |
| 2015/0119253 A1 | 4/2015 | Yohannes et al. |
| 2015/0219730 A1 | 8/2015 | Tsukamoto et al. |
| 2015/0236235 A1 | 8/2015 | Ladizinsky et al. |
| 2015/0372217 A1 | 12/2015 | Schoelkopf et al. |
| 2016/0079968 A1 | 3/2016 | Strand et al. |
| 2016/0170675 A1 | 6/2016 | Pickerell et al. |
| 2018/0053689 A1 | 2/2018 | Kirby et al. |
| 2018/0145631 A1 | 5/2018 | Berkley et al. |
| 2018/0219150 A1 | 8/2018 | Lanting et al. |
| 2018/0308896 A1* | 10/2018 | Ladizinsky ........ H10N 60/0912 |
| 2018/0337138 A1 | 11/2018 | Luu et al. |
| 2019/0019099 A1 | 1/2019 | Hoskinson et al. |
| 2019/0044044 A1 | 2/2019 | Lampert et al. |
| 2019/0044048 A1 | 2/2019 | George et al. |
| 2019/0164959 A1* | 5/2019 | Thomas ............. H01L 29/7613 |
| 2019/0288176 A1 | 9/2019 | Yoscovits et al. |
| 2019/0332965 A1 | 10/2019 | Barends |
| 2019/0369171 A1 | 12/2019 | Swenson et al. |
| 2020/0012961 A1 | 1/2020 | Kelly et al. |
| 2020/0144476 A1 | 5/2020 | Huang et al. |
| 2020/0152851 A1 | 5/2020 | Lanting et al. |
| 2020/0266234 A1 | 8/2020 | Boothby et al. |
| 2020/0287118 A1 | 9/2020 | Herr et al. |
| 2021/0190885 A1 | 6/2021 | Swenson et al. |
| 2021/0375516 A1 | 12/2021 | Sterling et al. |
| 2022/0123048 A1 | 4/2022 | Swenson et al. |
| 2023/0004851 A1 | 1/2023 | Harris et al. |
| 2023/0101616 A1 | 3/2023 | Volkmann et al. |

FOREIGN PATENT DOCUMENTS

| | | |
|---|---|---|
| CN | 102334206 A | 1/2012 |
| CN | 105914219 A | 8/2016 |
| EP | 0329603 A2 | 8/1989 |
| EP | 0437971 A1 | 7/1991 |
| EP | 0466611 A1 | 1/1992 |
| EP | 0476844 A1 | 3/1992 |
| EP | 0477495 A1 | 4/1992 |
| EP | 0732756 A2 | 9/1996 |
| EP | 0756335 A1 | 1/1997 |
| EP | 2401776 B1 | 8/2016 |
| JP | S60140885 A | 7/1985 |
| JP | S6215869 A | 1/1987 |
| JP | S6257263 A | 3/1987 |
| JP | S62200777 A | 9/1987 |
| JP | 63007675 A | 1/1988 |
| JP | S637675 A | 1/1988 |
| JP | S63226981 A | 9/1988 |
| JP | S6411357 U | 1/1989 |
| JP | S6476610 A | 3/1989 |
| JP | H027583 A | 1/1990 |
| JP | H03286578 A | 12/1991 |
| JP | H04246871 A | 9/1992 |
| JP | H04334074 A | 11/1992 |
| JP | H05102547 A | 4/1993 |
| JP | H05114756 A | 5/1993 |
| JP | H06260692 A | 9/1994 |
| JP | 08255937 | 1/1995 |
| JP | H07066462 A | 3/1995 |
| JP | H07245404 A | 9/1995 |
| JP | H08236823 A | 9/1996 |
| JP | H104223 A | 1/1998 |
| JP | 10200171 | 7/1998 |
| JP | 2001516970 A | 10/2001 |
| JP | 2001516970 T | 10/2001 |
| JP | 2003092436 A | 3/2003 |
| JP | 2004-079882 | 3/2004 |
| JP | 2004079882 A | 3/2004 |
| JP | 2004519102 A | 6/2004 |
| JP | 2005-39244 A | 2/2005 |
| JP | 2005039244 A | 2/2005 |
| JP | 2007150257 A | 6/2007 |
| JP | 2009111306 A | 5/2009 |
| JP | 2012519379 A | 8/2012 |
| JP | 6059754 B2 | 12/2016 |
| KR | 20000026669 A | 5/2000 |
| KR | 20010067425 A | 7/2001 |
| KR | 101465645 B1 | 11/2014 |
| KR | 20190035900 A | 4/2019 |
| WO | 99/14800 A1 | 3/1999 |
| WO | 0201327 A2 | 1/2002 |
| WO | 02069411 A2 | 9/2002 |
| WO | 2005093649 A1 | 10/2005 |
| WO | 2007085074 A1 | 8/2007 |
| WO | 2008138150 A1 | 11/2008 |
| WO | 2009120638 A2 | 10/2009 |
| WO | 2009149086 A2 | 12/2009 |
| WO | 2013180780 A2 | 12/2013 |
| WO | 2016025598 A1 | 2/2016 |
| WO | 2016183213 A1 | 11/2016 |
| WO | 2017192733 A2 | 11/2017 |
| WO | 2018144601 A1 | 8/2018 |
| WO | 2019055002 A1 | 3/2019 |
| WO | 2019179732 A1 | 9/2019 |
| WO | 2020212437 A1 | 10/2020 |
| WO | 2021231224 A1 | 11/2021 |
| WO | 2021262741 A1 | 12/2021 |
| WO | 2022178130 A1 | 8/2022 |
| WO | 2024102504 A2 | 5/2024 |

OTHER PUBLICATIONS

Blatter et al., "Design aspects of superconducting-phase quantum bits," Physical Review B 63: 174511-1-174511-9, 2001.

Bunyk et al., "Architectural Considerations in the Design of a Superconducting Quantum Annealing Processor," IEEE Trans. Appl.

(56) References Cited

OTHER PUBLICATIONS

Supercond., 24, arXiv:1401.5504v1 [quant-ph] Jan. 21, 2014, 9 pages.
Calusine et al., "Analysis and mitigation of interface losses in trenched superconducting coplanar wave resonators", Applied Physics Letters, 112(6):062601, Feb. 1, 2018.
Cava, et al., "Electrical and magnetic properties of Nb2O5-crystallographic shear structures", Phys. Rev. B44, 6973—Published Oct. 1, 1991.
Clauss et al., "Broadband electron spin resonance from 500 MHz to 40 GHz using superconducting coplanar waveguides", Applied Physics Letters, Apr. 1, 2013.
Clauss et al., "Optimization of Coplanar Waveguide Resonators for ESR Studies on Metals", Journal of Physics: Conference Series, Mar. 1, 2015.
Daalmans, "HTS DC SQUIDs for practical applications", Science Direct, Jul. 1, 1995.
De Graaf et al., "Direct Identification of Dilute Surface Spins on Al2O3: Origin of Flux Noise in Quantum Circuits", Physical Review Letters, Jan. 1, 2017.
De Graaf et al., "Suppression of low-frequency charge noise in superconducting resonators by surface spin desorption", Nature Communications, 9(1):1143, Dec. 1, 2018.
Diniz et al., "Intrinsic photon loss at the interface of superconducting devices", arXiv, Mar. 10, 2020.
Doerner, S., et al., "Compact microwave kinetic inductance nanowire galvanometer for cryogenic detectors at 4.2 K," J. Phys. Commun., 2018, 8 pages.
Extended European Search Report for EP 18747996.5, dated Sep. 3, 2020, 8 pages.
Friedrich et al., "Onset of phase diffusion in high kinetic inductance granular aluminum micro-SQUIDs", arXiv, Aug. 29, 2019.
Gao et al., "Experimental evidence for a surface distribution of two-level systems in superconducting lithographed microwave resonators", Applied Physics Letters, 92(15):152505, Apr. 1, 2018.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Hinode et al., "Fabrication of reliable via conductors for niobium SFQ devices," Physica C 426-431:1533-1540, 2005.
Holzman et al., "On-chip integrable planar NbN nanoSQUID with broad temperature and magnetic-field operation range", AIP Advances, Oct. 23, 2019.
Hori et al., "Electron spin resonance study on pure single crystalline sapphire", P hys. Status Solidi C 10, No. 12. 1681-1683 (Nov. 5, 2013).
Hunt et al., "NbN/MgO/NbN edge-geometry tunnel junctions", Applied Physics Letters 55, 1982.
International Search Report for PCT/US2018/016237, mailed Jul. 2, 2018, 6 pages.
International Search Report for PCT/US2020/018137, mailed Jun. 3, 2020, 4 pages.
Japanese Office Action for Japanese Patent Application No. 2020-073654, mailed Aug. 17, 2021 (with English Translation) 5 pages.
Johnson et al., "Scalable Control System for a Superconducting Adiabatic Quantum Optimization Processor," Superconductor Science & Technology (2010).
Kwon et al., "Magnetic Field Dependent Microwave Losses in Superconducting Niobium Microstrip Resonators"; Journal of Applied Physics, 124(3):033803, Jul. 1, 2018.
Lanting et al., "Evidence for temperature-dependent spin diffusion as a mechanism of intrinsic flux noise in SQUIDs", Physical Review B 89, 014503 (Jan. 7, 2014).
Lanting et al., "Geometrical dependence of the low-frequency noise in superconducting flux qubits", Physical Review B, 79, 060509, Jun. 5, 2009, 4 pages.
Levy-Bertrand et al., "Electrodynamics of granular aluminum from superconductor to insulator: observation of collective superconducting modes", arXiv, Mar. 13, 2019.
Lomatch et al., "Multilayer Josephson Flux Quantum Devices," IEEE Trans. Appl. Superconductivity, vol. 5, No. 2, Jun. 2, 1995.
Lucero, "Computing prime factors using a Josephson phase-qubit architecture: 15=3×5", A dissertation submitted in partial satisfaction of the requirements for the degree of Doctor of Philosophy in Physics, University of California Santa Barbara.
Il'ichev, et al. "Degenerate ground state in a mesoscopic YBa2Cu3O7-x grain boundary Josephson junction", Physical Review Letters, vol. 86, No. 23, Jun. 4, 2001, 4 pages.
Annunziata, et al., "Tunable superconducting nanoinductors", IOP Science, Oct. 15, 2010, 11 pages.
Balashov, et al., "Superconductor-insulator-normal-conductor-insulator-superconductor process development for integrated circuit applications", IOP Science, Dec. 1, 1998, 11 pages.
Bruder, et al., "Tunnel junctions of Unconventional Superconductors", Physical Review, 1995, 5 pages.
Larsson, et al., "Transport properties of submicron YBa2Cu3O7-d step-edge Josephson junctions", J. Appl. Phys. 90, 2001, 24 pages.
Lombardi, et al., "Tunnel barriers for an all-high-Tc single electron tunneling transistor", Physica C 368, 2002, 6 pages.
Martinis, et al., "UCSB final report for the CSQ program: Review of decoherence and materials physics for superconducting qubits", arXiv, Oct. 21, 2014, 10 pages.
Mazin, et al., "Thin film dielectric microstrip kinetic inductance detectors", arXiv, Feb. 1, 2010, 10 pages.
Ortlepp, et al., "RSFQ Circuitry Using Intrisic π-Phase Shifts", IEEE, Jun. 2007, 5 pages.
Schrieffer, et al., "Superconductivity", Rev. Mod. Phys., 71, 1999, 5 pages.
Sigrist, et al., "Unusual paramagnetic phenomena in granula high-temperature superconductors—A consequence of d-wave pairing?", Rev. Mod. Phys. 67, 1995, 5 pages.
Smilde, et al., "Y—Ba—Cu—O / Au / Nb Ramp-type Josephson Junctions", IEEE, 2001, 5 pages.
Tanaka, et al., "Theory of Josephson effects in anisotropic superconductor", Physical Review B 56, 1997, 21 pages.
Tolpygo, "Superconductor Digital Electronics: Scalability and Energy Efficiency Issues", arXiv, Feb. 10, 2016, 20 pages.
Tosi, et al., "Silicon quantum processor with robust long-distance qubit couplings", Nature, Sep. 6, 2017, 11 pages.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Friedman et al., "Quantum superposition of distinct macroscopic states," Nature 406:43-46, Jul. 6, 2000.
Harris et al., "Experimental Investigation of an Eight-Qubit Unit Cell in a Superconducting Optimization Processor," arXiv: 1004.1628v2, Jun. 28, 2010, 16 pages.
Ilichev, et al., "Continuous Monitoring of Rabi Oscillations in a Josephson Flux Qubit", Physical Review Letters 91(9):097906-1-097906-4, week ending Aug. 19, 2003.
Nielsen et al., "7.8 Other implementation schemes," in Quantum Computation and Quantum Information, 1st ed., Cambridge University Press, Cambridge, 2000, pp. 343-345.
Shor, "Introduction to Quantum Algorithms," AT&T Labs—Research, arXiv:quant-ph/0005003 v2, pp. 1-17, Jul. 6, 2001.
Unknown, "Slow-Wave Structures", Microwaves101.com, Jan. 15, 2021—Available at least as early as Jul. 4, 2018.
Non Final Office Action for U.S. Appl. No. 17/681,303, mailed May 17, 2023, 13 pages.
Non Final Office Action for U.S. Appl. No. 17/429,456, mailed Dec. 27, 2023, 23 pages.
Ex Parte Quayle Issued in U.S. Appl. No. 17/158,484, mailed Jan. 19, 2024, 9 pages.
Ramos et al., "Design for Effective Thermalization of Junctions for Quantum Coherence," IEEE Transactions on Applied Superconductivity 11(1):998-1001, Mar. 2001.
Chinese Office Action dated Mar. 30, 2023, for Chinese Application No. 201880021010X, 12 pages (English translation of action).
D-Wave Whitepaper, Early Progress on Lower Noise, 2022.
Fritzsch et al., "SNS and SIS Josephson junctions with dimensions down to the sub-μm region prepared by an unified technology," Supercond. Sci. Tech. 12: 880-882, 1999.

(56) References Cited

OTHER PUBLICATIONS

Gao et al., A Semiempirical Model for Two Level System Noise in Superconducting Microresonators, Applied Physics, 2008.
International Search Report and Written Opinion, mailed Oct. 13, 2021. for PCT/US2021/038519, 9 pages.
Kauppinen, et al., "Coulomb Blockade Thermometer: Tests and Instrumentation", Review of Scientific Instruments, vol. 69, #12, 1998.
Kosen, et al., "Building Blocks of a Flip Chip Integrated Superconducting Quantum Processor", arXiv 2112.02717v2, 2022.
Lee, "The Feasibility of Au Bonding on SN-Plated Cu", Journal of Electronic Materials, 2007.
Logothetidis, et al., "Room Temperature Oxidation Behavior of TiN Thin Films", 1999.
Luo, "Superconductivity In Noble-Metal-Rich Hexagonal Close-Packed Phases", 1970.
McCrory, et al., "Wafer-Level Electrically Detected Magnetic Resonance: Magnetic Resonance in a Probing Station", 2018.
Mcintyre, "The Effect of Annealing and Heating Deposition on Alpha and Beta Phase Formation for Tantalum Thin Films", 2018.
Narkowicz, et al., "Planar Microresonators For EPR Experiments", Science Direct, 2005.
Ni, et al., "Demonstration of Tantalum as a Structural Material for MEMS Thermal Actuators", 2021.
Non-Final Office Action Issued in U.S. Appl. No. 16/870,537, mailed Jul. 19, 2023, 9 pages.
Shoji et al., "New fabrication process for Josephson tunnel junctions with (niobium nitride, niobium) double-layered electrodes," Appl. Phys. Lett. 41(11): 1097-1099, Dec. 1, 1982.
Veinger, "Technique for Magnetic Susceptibility Determination in the High Doped Semiconductors by Electron Spin Resonance", 2013.
Vladoiu, "Growth and Characteristics of Tantalum Oxide Thin Films Deposited Using Thermionic Vacuum Arc Technology", 2010.
Wang, "Towards Practical Quantum Computers: Transmon Qubit With a Lifetime Approaching 0.5 Milliseconds", 2022.
Zednicek, "Niobium and Niobium Oxide Capacitors Overview", 2019.
Zhang, et al., "Characterization of Surface Oxidation Layers on Ultrathin NvTiN Films", 2018.
Blanquart et al. , et al., "Evaluation and Comparison of Novel Precursors for Atomic Layer Deposition of $Nb_2O_5$ Thin Films", Chem. Mater., Feb. 8, 2012, 6 pages.
Born , et al., "Fabrication of Ultrasmall Tunnel Junctions by Electron Beam Direct-Writing", IEEE, 2001, 4 pages.
Buchholz, et al., "LTS junction technology for RSFQ and qubit circuit applications", Science Direct, Jul. 24, 2006, 8 pages.
Campbell , et al., "Dynamics of Oxidation of Aluminum Nanoclusters using Variable Charge Molecular-Dynamics Simulations on Parallel Computers", APS Physics, Jun. 14, 1999, 4 pages.
Chan , et al., "Interface between gold and superconducting $YBa_2Cu_3O_7$-x", J. Mater. Res, 1995, 6 pages.
Cucolo , et al., "Linear normal conductance in copper oxide tunnel junctions", Phys. Rev. B 54, 1996, 3 pages.
Dagan , et al., "C-axis tunneling on YBCO films", Eur. Phys. J. B 19, 2001, 5 pages.
Dimos , et al., "Orientation Dependence of Grain-Boundary Critical Currents in $YBa_2Cu_3O_7$ Biocrystals", Physical Review Letters, Jul. 11, 1988, 5 pages.
Dolata , et al., "Platinum thin film resistors with Cr under- and overlayers for $Nb/Al_2O_3$/Nb technology", Science Direct, Jul. 19, 2005, 4 pages.
Faucher , et al., "Niobium and niobium nitride SQUIDs based on anodized nanobridges made with an atomic force microscope", Science Direct, Mar. 1, 2002, 7 pages.
Geerlings , et al., "Improving the Quality Factor of Microwave Compact Resonators by Optimizing their Geometrical Parameters", Applied Physics Letters, 2012, 4 pages.

Grabert , et al., "Mesoscopic Josephson effect", Superlattices and Microstructures 25, 2019, 10 pages.
Grünhaupt , et al., "Granular aluminum: A superconducting material for high impedance quantum circuits", arXiv, Sep. 27, 2018, 9 pages.
Grünhaupt , et al., "Quasiparticle dynamics in granular aluminum close to the superconductor to insulator transition", arXiv, Feb. 7, 2018.
Hadfield , et al., "Novel Josephson junction geometries in NbCu bilayers fabricated by focused ion beam microscope", Physica C. North-Holland Publishing, Amsterdam, Feb. 15, 2002, 9 pages.
Harris , "Improved coherence leads to gains in quantum annealing performance", D-Wave, 2019, 4 pages.
Havemann , et al., "High-performance interconnects: an integration overview", IEEE, May 2001, 16 pages.
Herr , et al., "Reproducible Operating Margins on a 72,800-Device Digital Superconducting Chip", arXiv, Oct. 5, 2015, 6 pages.
Hilgenkamp , et al., "Implications of $dx^2-y^2$ symmetry and faceting for the transport properties of grain boundaries in high-TC superconductors", Physical Review B 53, 1996, 8 pages.
Hinode , et al., "Fabrication of reliable via conductors for niobium SFQ devices", Science Direct, Jul. 19, 2005, 8 pages.
Hypres , "Niobium Integrated Circuit Fabrication Process #S45/100/200 Design Rules", Hypres, Mar. 10, 2015, 9 pages.
Iguchi , et al., "Experimental evidence for a d-wave pairing state in $YBa_2Cu_3O_7$-y from a study of $YBa_2Cu_3O_7$-y/ insulator/Pb Josephson tunnel junctions", Phys. Rev. B 49, 1994, 4 pages.
Il'Ichev , et al., "Nonsinusoidal Current-Phase Relationship of Grain Boundary Josephson junctions in High-Tc Superconductors", Physical Review Letters 81, 1998, 4 pages.
Joyez , et al., "Observation of Parity-Induced Suppression of Josephson Tunneling in the Superconducting Single Electron Transistor", Phys. Rev., Lett. 72, Jul. 19, 2005, 5 pages.
Koelle , et al., "High-transition-temperature superconducting quantum interference devices", Reviews of Modern Physics 71, 199, 56 pages.
Kohl , "Low-Dielectric Constant Insulators for Future Integrated Circuits and Packages", Georgia Tech, Mar. 14, 2011, 25 pages.
Kouznetsov , et al., "c-axis Josephson Tunneling between $YBa_2Cu_3O_7$-8 and Pb: Direct Evidence for Mixed Order Parameter Symmetry in a High-Tc Superconductor", Phys. Rev. Lett. 79, 1997, 4 pages.
Kubatkin , et al., "Coulomb blockade electrometer with a high-Tcisland", JETP Letters 63, 1996, 7 pages.
Levinsen , "Electromagnetic properties of the Dayem bridge", HAL Archives, Jan. 1, 1974, 11 pages.
Maleeva , et al., "Circuit Quantum Electrodynamics of Granular Aluminum Resonators", arXiv, Feb. 7, 2018, 17 pages.
Martinis , et al., "Critical Field for Complete Vortex Expulsion from Narrow Superconducting Strips", UCSB, Mar. 5, 2004, 4 pages.
Matveev , et al., "Parity-Induced Suppression of the Coulomb Blockade of Josephson Tunneling", Phys. Rev. Lett. 70, 1993, 4 pages.
McKenney , et al., "Design considerations for a background limited 350 micron pixel array using lumped element superconducting microresonators" , SPIE, Sep. 24, 2012, 10 pages.
Nagasawa , et al., "Development of advanced Nb process for SFQ circuits", Science Direct, Jun. 9, 2004, 8 pages.
Potts , et al., "CMOS compatible fabrication methods for submicron Josephson junction qubits" IEEE, Sep. 5, 2001, 4 pages.
Russo , et al., "Characterization of Superconducting Thin Films and nanoSQUIDs for Nanoparticle Investigation at High Magnetic Field", IEEE, Feb. 18, 2012, 4 pages.
Satoh , et al., "Fabrication process of planarized multi-layer Nb Integrated circuits", IEEE, Jun. 13, 2005, 4 pages.
Satoh , et al., "Planarization of Josephson junctions for large-scale integrated Nb SFQ circuits by mechanical polishing", Science Direct, 1999, 4 pages.
Tafuri , et al., "Feasibility of Blepitaxial YbaCuO Josephson Junctions for Fundamental Studies and Potential Circuit Implementation", Los Alamos National Laboratory preprint server condmat, Dec. 18, 2002, 21 pages.

(56) References Cited

OTHER PUBLICATIONS

Tolpygo, et al., "Deep Sub-Micron Stud-Via Technology for Superconductor VLSI Circuits", IOP Science, Jan. 14, 2014, 10 pages.
Tsuei, et al., "Pairing symmetry in cuprate superconductors", Reviews of Modern Physics 72, 2000, 48 pages.
Valenti, et al., "Interplay between kinetic inductance, non-linearity and quasiparticle dynamics in granular aluminum MKIDs", arXiv, Nov. 10, 2018, 14 pages.
Van Harlingen, "Phase-sensitive tests of the symmetry of the pairing state in the high-temperature superconductors-Evidence for dx2-y2 symmetry", Rev. Mod. Phys. 67, 1995, 23 pages.
Vinante, et al., "Hot-electron effect in palladium thin films", APS Physics, Mar. 13, 2007, 5 pages.
Wen, et al., "Microstructure of ramp-edge Yba2Cu3O3/PrBa2Cu3O2 Josephson junctions on different substrates", Physica C 255, 1995, 13 pages.
Wollman, et al., "Evidence for dx2-y2 Pairing from the Magnetic Field Modulation of YBa2Cu3O7-Pb Josephson Junctions". Phys. Rev. Lett 74, Jan. 30, 1995, 4 pages.
Yohannan, "Characterization of alpha and beta phases of tantalum coatings", New Jersey Institute of Technology, Aug. 31, 2001, 107 pages.
Zantye, Parshuram B, et al., "Chemical mechanical planarization for microelectronics application", Materials Science and Engineering R 45 (2004) 89-220. 2004 (Year: 2004), 132 pages.
Brecht, et al., "Multilayer Microwave Integrated Quantum Circuits for Scalable Quantum Computing", npj Quantum Information (2016) 16002.
Campbell, et al., "Electron Spin Resonance Scanning Probe Spectroscopy for Ultrasensitive Biochemical Studies", Analytical Chemistry Publications, Anal. Chem. 2015, 87, 4910-4915, 7 pages.
Dhakal, et al., "Flux expulsion in niobium superconducting radio-frequency cavities of different purity and essential contributions in the flux sensitivity", arXiv:1906.04163, Pub. Jun. 6, 2019.
Henry, et al., "Degradation of Superconducting Nb/NbN Films by Atmospheric Oxidation", IEEE Transactions on Applied Superconductivity, IEEXplore, 1051-8223, 2017, 5 pages.
Hu, "Advanced Composites Material" pp. 197-201—Chinese, 2019.
Martinis, et al., "Decoherence in Josephson Qubits from Dielectric Loss", arXiv:cond-mat/0507622v1 [cond-mat.mtrl-sci] Jul. 26, 2005.
Semenov, et al., "How Moats Protect Superconductor Films from Flux Trapping", IEEE Transactions on Applied Superconductivity, 1051-8223, 2016 IEEE, 20 pages.
Semenov., "AC-Biased Shift Registers as Fabrication Process Benchmark Circuits and Flux Trapping Diagnostic Tool", arXiv:1701.03837, Published Dec. 29, 2016, 9 pages.
Bronn, et al., "High Coherence Plane Breaking Packaging for Superconducting Qubits", arXiv:1709.02402v2 [quant-ph] Feb. 14, 2018, 101 pages.
Chapter: Appendix C: Superconducting Quantum Computers, Quantum, Computing Progress and Prospects, the National Academies Press, 2019, 10 pages.
Chen et al., "Qubit architecture with high coherences and fast tunable coupling", Physical Review Letters, Feb. 28, 2014. https://arxiv.org/abs/1402.7367.
DeGraaf, et al., "Suppression of low-frequency charge noise in superconducting resonators by surface spin desorption", Supplementary Information, 8 pages.
Elsherbini, et al., "Flip Chip Packaging for Superconducting Quantum Computers", APS—APS March Meeting 2018—Event—vol. 63, No. 1, 1 page.
Fourie, et al., "Wk2EOr3B-05—Experimental verification of moat design and flux trapping analysis", Stellenbosch University, ASC 2020, Virtual Conference, Nov. 4, 2020.
Foxen, et al., Qubit compatible superconducting interconnects, arXiv:1708.04270v2 [quant-ph], Sep. 29, 2017, 19 pages.
Fritz, et al., "Optimization of Al/AlOx/Al-layer systems for Josephson Junctions from a microstructure point of view", Journal of Applied Physics, 125, 165301 (2019). 11 pages.
Gargiulo, et al., "Fast flux control of 3D transmon qubits using a magnetic hose", : Appl. Phys. Lett. 118, 012601 (2021); https://doi.org/10.1063/5.0032615, 7 pages.
Hilton, et al., "Fabrication of prototype imaging arrays for SCUBA-2", Preprint submitted to Elsevier Science, Oct. 3, 2005.
Hsu_"CES 2018 Inte'ls 49-Qubit Chip Shoots for Quantum Supremacy", IEEE Spectrum, 4 pages.
Kamal., et al., "Improved superconducting qubit coherence with high-temperature substrate annealing", arXiv:1606.09262v1 [cond-mat.mes-hall] Jun. 29, 2016, 10 pages.
Koch, et al., "Charge-insensitive qubit design derived from the Cooper pair box", Physical Review A 76, 042319 (2007), 19 pages.
Lei, et al., "High coherence superconducting microwave cavities with indium bump bonding", Appl. Phys. Lett. 116, 154002 (2020), 6 pages.
MIT, "Superconducting Integrated Circuits", Lincoln Laboratory, Technology in Support of National Security, 2 pages.
Narayana, et al., "Design and testing of high-speed interconnects for Superconducting multi-chip modules", MIT Lincoln Laboratory, 244 Wood Street, 2012, 16 pages.
Nguyen et al., "The high-coherence fluxonium qubit", arXiv:1810.11006v1, Oct. 25, 2018.
Rich, "DC SQUID Magnetometry", Christopher Bennett Rich 2019 Thesis, Simon Fraser University Fall 2019, 58 pages.
Rosenberg, et al., "3D integrated superconducting qubits", arXiv:1706.04116v2 [quant-ph] Jun. 19, 2017, 6 pages.
Sharma, "Fabrication and Characterization of AL/ALOx/AL Josephson Junctions", Mater of Science, Texas A&M University, Dec. 2015, 84 pages.
Shen, et al., "Character and fabrication of Al/al2o3/al tunnel junctions for qubit application", Chinese Science Bulletin, Feb. 2012 Vo. 57 No. 4: 409-412.
Simmonds, et al., "Josephson Junction Materials Research Using Phase Qubits", May 30, 2006, pp. 86-94.
Steffen, et al., "Recent research trends for high coherence quantum circuits", IOP Publishing, Supercond. Sci. Technol, 30 (2017), 5 pages.
Tennant, et al., "Low frequency correlated charge noise measurements across multiple energy transitions in a tantalum transmon", arXiv:2106.08406v1 [quant-ph] Jun. 15, 2021.
Tolpygo, et al., "Process-Induced Variability of Nb/Al/Alox/Nb Junctions in Superconductor Integrated Circuits and Protection Against It", IEEE Transactions on Applied Superconductivity, vol. 19, No. 3, Jun. 2009, 5 pages.
Toplygo, et al., "Wafer Bumping Process and Inter-Chip Connections for Ultra-High Data Transfer Rates in Multi-Chip Modules With Superconductor Integrated Circuits", IEEE Transactions on Applied Superconductivity, 2009, 5 pages.
Tournet, "Growth and Characterization of Epitaxial Al Layers on GaAs and Si Substrates for Superconducting CPW Resonators in Scalable Quantum Computing Systems", Thesis 2015, 161 pages.
Weides, et al., "Phase qubits fabricated with trilayer junctions", 7 pages.
Stan, et al., "Critical Field for Complete Vortex Expulsion from Narrow Superconducting Strips", Physical Review Letters, vol. 92, No. 9, Mar. 5, 2004.
Anlage, et al., "A current controlled variable delay superconducting transmission line", IEEE, pp. 1388-1391.
Berkley, et al., "A scalable readout system for a superconducting adiabatic quantum optimization system", arXiv, May 6, 2009, 18 pages.
Dagan, et al., "Absence of Andreev reflections and Andreev bound states above the critical temperature", Phys. Rev. B 61, 2000, 5 pages.
Eom, et al., "A Wideband, Low-Noise Superconducting Amplifier with High Dynamic Range", arXiv, Jan. 11, 2012, 23 pages.
Kerber, et al., "An improved NbN integrated circuit process featuring thick NbN ground plane and lower parasitic circuit inductances", IEEE, Jun. 1997, 6 pages.
Lisitskii, et al., "Annular Josephson junctions for radiation detection: fabrication and investigation of the magnetic behavior", Nuclear Instruments & Methods in Physics Research, Apr. 2000, 11 pages.

(56) References Cited

OTHER PUBLICATIONS

Macco, et al., "Atomic-layer deposited Nb2)5 as transparent passivating electron contract for c-Si solar cells", Science Direct, Sep. 2018, 7 pages.
Nicoletti, et al., "Bi-epitaxial YBCO grain boundary Josephson junctions on SrTiO3 and sapphire substrates", Physica C 269, 1996, 13 pages.
Tolpygo, et al., "Advanced Fabrication Processes for Superconducting Very Large-Scale Integrated Circuits", IEEE, Jan. 19, 2016.
Yoon, et al., "Atomic-scale chemical analyses of niobium oxide/niobium interfaces via atom-probe tomography", AIP Applied Physics Letters, Oct. 2, 2008, 3 pages.
Racah et al., "Properties of normal metal/dielectric/high-Tojunctions obtained by in-situ oxidation", Physica C 263, 1996.
Muller et al., "Towards understanding two-level-systems in amorphous solids—Insights from quantum circuits", arXiv:1705.01108v3, Oct. 10, 2019.
Makhlin et al., "Quantum-state engineering with Josephson-junction devices," Reviews of Modern Physics 73(2):357-400, Apr. 2001.
Malissa et al., "Superconducting coplanar waveguide resonators for low temperature pulsed electron spin resonance spectroscopy", Review of Scientific Instruments, Feb. 1, 2013.
Martens et al., "Sparameter measurements on singe superconducting thin-film three-terminal devices made of high-Tc and low-Tc materials", J. Appl. Phys. 65, 1989.
Mason, "Surface Impedance of Thin Superconducting Films", California Institute of Technology, 1962.
McRae et al., "Materials loss measurements using superconducting microwave resonators", arXiv:2006.04718 [physics, physics:quant-ph], Sep. 1, 2000.
Mooij et al., "Josephson Persistent-Current Qubit," Science 285:1036-1039, Aug. 13, 1999.
Morton & Bertet, "Storing quantum information in spins and high-sensitivity ESR", Journal of Magnetic Resonance, 287:128-139, Feb. 1, 2018.
N/A, "Antifuse", Wikipedia, Nov. 16, 2019.
N/A, "Low-k dielectric", Wikipedia, Apr. 14, 2020.
Niepce et al., "Geometric scaling of two-level-system loss in superconducting resonators", Superconducting Science and Technology, 33(2):025013, Jan. 1, 2020.
NSA, "Superconducting Technology Assessment", National Security Agency Office of Corporate Assessments, Aug. 1, 2005, 257 pages.
Office Action in Application No. 2019-562235, mailed Mar. 11, 2022 (English translation, 5 pages).
Oliver et al., "MRS Bulletin" vol. 38, pp. 816-825 (2013).
Peltonen, J.T., et al., "Hybrid rf SQUID qubit based on high kinetic inductance," Scientific Reports, Jul. 3, 2018, 8 pages.
Place et al., "New material platform for superconducting transmon qubits with coherence times exceeding 0.3 milliseconds", arXiv, Feb. 28, 2020.
Place et al., "Supplementary Materials for New material platform for superconducting transmon qubits with coherence times exceeding 0.3 milliseconds", Feb. 1, 2021.
Ramzi et al., "Niobium and Aluminum Josephson Junctions Fabricated with a Damascene CMP Process", Physics Procedia, vol. 36, 2012, p. 211-216.
Schulz et al., "Design and realization of an all d-wave do pi-superconducting quantum interference device", Appl. Phys. Lett. 76, 2000.
Schuster et al., "High cooperativity coupling of electron-spin ensembles to superconducting cavities", Physical Review Letters, 105(14):140501, Sep. 1, 2010.
Sears, "Extending Coherence in Superconducting Qubits: from microseconds to milliseconds", PhD thesis, Yale, Jan. 1, 2013.
Sigillito et al., "Fast, low-power manipulation of spin ensembles in superconducting microresonators", Applied Physics Letters, 104(22):222407, Jun. 1, 2014.
Sun et al., "Direction of tunneling in Pb/ I /YBa2Cu3O7-x tunnel junctions", Phys Rev B 54, 1996.
Swenson et al., "Operation of a titanium nitride superconducting microresonator detector in the nonlinear regime," arXiv:1305.4281v1 [cond-mat.supr-con], May 18, 2013, 11 pages.
Tokunaga et al., "SiO2 passivation film effects on YBCO junctions", Science Direct, Sep. 10, 1998.
Tolpygo et al., "Advanced Fabrication Processes for Superconducting Very Large Scale Integrated Circuits," IEEE Transactions on Applied Superconductivity 26(3):1-10, Jan. 19, 2016.
Tolpygo et al., "Deep sub-micron stud-via technology of superconductor VLSI circuits," Supercond. Sci. Technol. 27:1-9, Jan. 14, 2014.
Valles et al., "Electron tunneling into single crystals of YBa2Cu3O7-$\delta$", Phys. Rev. B 44, 1991.
Verjauw et al., "Investigation of microwave loss induced by oxide regrowth in high-Q Nb resonators", Physical Review Applied, p. 16, Jan. 1, 2020.
VLSI-expert.com, "Parasitic Interconnected Corner (RC corner) Basics—Part 1", hhtp:www.visi-expert.com/2012/02/parasitic-interconnected-corner-rc-corner.html, Feb. 12, 2012 (Year:2012), 7 pages.
Voesch et al., "On-Chip ESR Measurements of DPPH at mK Temperatures", Physics Procedia, 75:503-510, Jan. 1, 2015.
Voss et al., "Submicron Nb—Al-oxide-Nb junctions for frequency mixers", Superconductor Science and Technology 6, 1993.
Wallace & Silsbee, "Microstrip resonators for electron-spin resonance", Review of Scientific Instruments, 62(7):1754-1766, Jul. 1, 1991.
Wang et al., "FTIR Characterization of Fluorine Doped Silicon Dioxide Thin Films Deposited by Plasma Enhanced Chemical Vapor Deposition", IOP Science, Apr. 21, 2000.
Weichselbaumer et al., "Quantitative modeling of superconducting planar resonators with improved field homogeneity for electron spin resonance", Physical Review Applied, 12(2):024021, Aug. 1, 2019.
Winkel, "Implementation of a transmon qubit using superconducting granular aluminum", arXiv, Nov. 7, 2019.
Woods et al., "Determining interface dielectric losses in superconducting coplanar waveguide resonators", arXiv:1808.10347 [cond-mat,physics:quant-ph], Aug. 1, 2018.
Written Opinion for PCT/US2018/016237, mailed Jul. 2, 2018, 30 pages.
Written Opinion for PCT/US2020/018137, mailed Jun. 3, 2020, 10 pages.
Tolpygo, Sergey K., et al., "Superconductor Electronics Fabrication Process with MoNx Kinetic Inductors and Self-Shunted Josephson Junctions," IEEE Transactions on Applied Superconductivity 28(4), Jun. 2018, 12 pages.
Whittaker, J.D., et al., "A frequency and sensitivity tunable microresonator array for high-speed quantum," arXiv:1509.05811v2 [quant-ph], Apr. 22, 2016, 8 pages., Apr. 22, 2016.
Extended EP Search Report mailed Dec. 1, 2023, EP App No. 20897378.4-1212, 10 pages.
Notice of Allowance for U.S. Appl. No. 17/321,819, mailed Nov. 8, 2023, 10 pages.
European Office Action dated Nov. 4, 2024, for European Patent Application No. 20897378.4, 9 pages.
Japanese Office Action dated Dec. 2, 2024, for Japanese Patent Application No. 2022-529541, 7 pages (original and English translation of action).

* cited by examiner

SYSTEMS AND METHODS FOR FABRICATING FLUX TRAP MITIGATING SUPERCONDUCTING INTEGRATED CIRCUITS

FIELD

This disclosure generally relates to systems and methods for fabrication of superconducting integrated circuits, and in particular, relates to fabricating superconducting integrated circuits that include flux trapping by design.

BACKGROUND

Superconducting Processor

A quantum processor may take the form of a superconducting processor. Superconducting processors may also include processors that are not intended for quantum computing. For instance, some implementations of a superconducting processor may not focus on quantum effects such as quantum tunneling, superposition, and entanglement but may rather operate by emphasizing different principles, such as for example the principles that govern the operation of classical computer processors. There may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use in fabricating both superconducting quantum processors and superconducting classical processors.

Superconducting Qubits

Superconducting qubits are a type of superconducting quantum device that may be included in a superconducting integrated circuit. Superconducting qubits may be separated into several categories depending on the physical property used to encode information. For example, superconducting qubits may be categorized into charge, flux and phase devices. Charge devices store and manipulate information in the charge states of the device. Flux devices store and manipulate information in a variable related to the magnetic flux through some part of the device. Phase devices store and manipulate information in a variable related to the difference in superconducting phase between two regions of the device. Recently, hybrid devices using two or more of charge, flux and phase degrees of freedom have been developed. Superconducting qubits commonly include at least one Josephson junction. A Josephson junction is a small interruption in an otherwise continuous superconducting current path and is typically realized by a thin insulating barrier sandwiched between two superconducting electrodes. Thus, a Josephson junction is usually formed as a three-layer or "trilayer" structure. Superconducting qubits are further described in, for example, U.S. Pat. Nos. 7,876,248, 8,035,540, and 8,098,179.

Integrated Circuit Fabrication

An integrated circuit is also referred to in the present application as a chip, and a superconducting integrated circuit is also referred to in the present application as a superconducting chip.

Traditionally, the fabrication of superconducting integrated circuits has not been performed at state-of-the-art semiconductor fabrication facilities. This may be because some of the materials used in superconducting integrated circuits may contaminate the semiconductor facilities. For instance, gold may be used as a resistor in superconducting circuits, but gold may contaminate a fabrication tool used to produce complementary metal-oxide-semiconductor (CMOS) wafers in a semiconductor facility.

Superconductor fabrication has typically been performed in research environments where standard industry practices could be optimized for superconducting circuit production. Superconducting integrated circuits are often fabricated with tools that are traditionally used to fabricate semiconductor chips or integrated circuits. Due to issues unique to superconducting circuits, not all semiconductor processes and techniques are necessarily transferrable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Any impurities within superconducting chips may result in noise which may compromise or degrade the functionality of the individual devices, such as superconducting qubits, and of the superconducting chip as a whole. Since noise is a serious concern to the operation of quantum computers, measures should be taken to reduce noise wherever possible.

Hamiltonian Description of a Quantum Processor

In accordance with some implementations of the present systems and devices, a quantum processor may be designed to perform adiabatic quantum computation and/or quantum annealing. A common problem Hamiltonian includes first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N} h_i \sigma_i^z + \sum_{j>i}^{N} J_{ij}\sigma_i^z\sigma_j^z\right] \quad (1)$$

where N represents the number of qubits, $\sigma_i^z$ is the Pauli z-matrix for the $i^{th}$ qubit, $h_i$ and $J_{i,j}$ are dimensionless local fields for the qubits, and couplings between qubits, and E is some characteristic energy scale for Hp. Here, the $\sigma_i^z$ and $\sigma_i^z\sigma_j^z$ terms are examples of "diagonal" terms. The former is a single qubit term and the latter a two qubit term. Hamiltonians may be physically realized in a variety of different ways, for example, by an implementation of superconducting qubits.

Noise in a Quantum Processor

Low noise is a desirable characteristic of quantum devices. Noise may compromise or degrade the functionality of the individual devices, such as superconducting qubits, and of the superconducting processor as a whole. Noise may negatively affect qubit coherence and reduce the efficacy of qubit tunneling. Since noise is a serious concern to the operation of quantum processors, measures should be taken to reduce noise wherever possible so that a transition from coherent to incoherent tunneling is not induced by the environment.

Impurities may be deposited on the metal surface and/or may arise from an interaction with the etch/photoresist chemistry and the metal. Noise may be caused by impurities on the upper surface of the quantum processor. In some cases, superconducting devices that are susceptible to noise are fabricated in the top wiring layers of a superconducting integrated circuit and are thus sensitive to post-fabrication handling. There is a risk of introducing impurities that cause noise during post-fabrication handling. One approach to reducing noise is using a barrier passivation layer, for example, an insulating layer, to overlie the topmost wiring layer. The use of a barrier passivation layer to minimize noise from impurities on the upper surface of a quantum processor is described in US Patent Application No. 2018/02219150A1.

Noise may also result from an external environment or surrounding circuitry in a superconducting processor. In a quantum processor, flux noise on qubits interferes with properly annealing the quantum processor because of the steep transition between qubit states as the flux bias is swept. Flux noise may be a result of current flowing through wiring of other devices included in the superconducting processor and may have a particularly negative effect on qubits at their respective degeneracy points. For example, flux noise may introduce errors in calculations carried out by the superconducting processor due to inaccuracies in setting flux bias and coupling strength values. Such values are important to using an integrated circuit as part of a quantum processor. Much of the static control error may be designed out of the processor with careful layout and high-precision flux sources, as well as by adding circuitry, such as an on-chip shield, to tune away any non-ideal flux qubit behavior. However, in many cases, limitations in integrated circuit fabrication capabilities may make it difficult to address noise by changing processor layout and adding circuitry. There is thus a general desire for systems and methods to fabricate integrated circuits that have reduced flux noise.

Shielding

Magnetic fields produced by external sources may cause unwanted interactions with devices in the integrated circuit. Accordingly, there may be a need for a superconducting shield proximate to devices populating the integrated circuit to reduce the strength of interference such as magnetic and electrical fields. An example of this is discussed in WO 96/09654.

Superconducting shielding incorporated into an integrated circuit has been used to protect superconducting quantum interference device (SQUID) packages from DC and AC noise, such as magnetic and electrical fields, that would otherwise interfere with operation of the integrated circuit. Regions of the integrated circuit may be unshielded to allow for communication between magnetic and electrical fields external to the SQUID package. An example of this approach is discussed in U.S. Pat. No. 5,173,660.

Superconducting shielding layers may be used in single flux quantum (SFQ) or rapid single flux quantum (RSFQ) technology to separate devices from DC power lines that could otherwise undesirably bias the devices. The devices populate the integrated circuit but are separated from the DC power lines by placing a ground plane between the devices and the DC power line. Examples of this type of approach are described, for example, in Nagasawa et al., "Development of advanced Nb process for SFQ circuits" Physica C 412-414 (2004) 1429-1436 (herein referred to as Nagasawa) and Satoh et al., "Fabrication Process of Planarized Multi-Layer Nb Integrated Circuits" IEEE Transactions on Applied Superconductivity, Vol. 15, No. 2, (June 2005).

In SFQ circuits, ground planes and shielding layers are terminologies used interchangeably. A ground plane in SFQ integrated circuit is a layer of metal that appears to most signals within the circuit as an infinite ground potential. The ground plane helps to reduce noise within the integrated circuit and may also be used to ensure that all components within the SFQ integrated circuits have a common potential to compare voltage signals. Nagasawa shows the use of contacts between wiring layers and a ground plane throughout SFQ circuitry.

Supercurrent flowing in superconducting wires has an associated magnetic field in the same manner as electrons flowing in normal metal wires. Magnetic fields may couple inductively to superconducting wires, inducing currents to flow. Quantum information processing with superconducting integrated circuits necessarily involves supercurrents moving in wires, and hence associated magnetic fields. The quantum properties of quantum devices are very sensitive to noise, and stray magnetic fields in superconducting quantum devices may negatively impact the quantum information processing properties of such circuits.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

According to an aspect, there is provided a method for mitigating flux trapping in a superconducting integrated circuit, the method comprising forming a first device, the first device comprising at least a portion of a first metal layer within the superconducting integrated circuit, the first metal layer comprising a first superconducting material having a first critical temperature and forming a flux-directing layer comprising a second superconducting material having a second critical temperature, wherein the first superconducting material and the second superconducting material are selected such that as the superconducting integrated circuit is cooled from a first temperature that is greater than both the first critical temperature and the second critical temperature to a second temperature that is less than both the first critical temperature and the second critical temperature, a relative temperature difference between the first critical temperature and the second critical temperature causes the flux-directing layer to direct flux away from the first device and towards a flux-trapping location spaced from the first device, the flux becoming trapped at the flux-trapping location and isolated from the first device as the superconducting integrated circuit is cooled.

According to other aspects, forming a flux-directing layer may include forming a flux-directing layer positioned in flux-transmitting communication with the flux-trapping location, and causing the flux-directing layer to direct flux away from the first device and towards a flux-trapping location may include causing the flux-directing layer to direct flux into the flux-trapping location, the method may further comprise forming a flux-trapping aperture at the flux-trapping location, forming a flux-trapping aperture at the flux-trapping location may comprise forming one of a parallel-piped opening and a trough within the superconducting integrated circuit at the flux-trapping location, the method may further comprise forming shielding to enclose the flux-trapping location, forming shielding to enclose the flux-trapping location may comprise forming a plurality of superconducting stud vias within the superconducting integrated circuit, forming a flux-directing layer may comprise depositing a superconducting metal layer comprising an opening aligned with the flux-trapping aperture, forming a first device may comprise forming a first device as one of a qubit and a coupler, forming a first device may comprise forming the first metal layer to overlie at least a portion of the flux-directing layer, and forming a flux-directing layer may comprise selecting the second critical temperature to be less than the first critical temperature, the method may further comprise forming a second metal layer adjacent to the first metal layer, the second metal layer may comprise a shielding structure that shields the first device, and the second metal layer may comprise a superconducting material having a third critical temperature, forming a flux-directing layer comprising a second superconducting material may include providing a relative temperature difference between the second critical temperature and the third critical temperature to direct flux away from the first device and trap flux in the flux-trapping location, forming a first device may comprise forming the first metal layer to overlie at least a portion of the flux-directing layer, and forming a flux-directing layer may comprise selecting the second critical temperature to be less than the third critical temperature, the method may further comprise forming one or more additional superconducting metal layers overlying at least a portion of the flux-directing layer, the critical temperature of each of the one or more additional superconducting metal layers may be greater than the second critical temperature, forming a first metal layer, forming one or more additional superconducting metal layers, and forming a flux-directing layer may include selecting a respective critical temperature of each layer to increase incrementally by layer from the flux-directing layer to an uppermost layer of the first metal layer and the one or more additional superconducting metal layers, forming the flux-directing layer comprising a second superconducting material may comprise forming a flux-directing layer overlying at least a portion of the first metal layer, the method may further comprise forming a second metal layer, the first metal layer may overlie at least a portion of the second metal layer, the second metal layer may comprise a shielding structure that shields the first device, the second metal layer may comprise a superconducting material having a third critical temperature, and the method may further comprise forming a base metal layer, the second metal layer may overlie the base metal layer, the third critical temperature may be greater than the critical temperature of the base metal layer, and the critical temperature of the base metal layer may be greater than the second critical temperature, forming a flux-directing layer using a second superconducting material may comprise selecting the second critical temperature to be greater than the first critical temperature, forming a flux directing layer may include forming flux-trapping structures overlying at least a portion of the flux-trapping location, forming flux-trapping structures may include forming at least one moat, the method may further comprise forming a second device within the flux-trapping location, forming a second device within the flux trapping location may comprise forming a digital to analog converter, forming a flux-directing layer comprising a second superconducting material may comprise forming a flux-directing layer comprising a high kinetic inductance material, and forming a flux-directing layer comprising a high kinetic inductance material may further comprise forming at least one moat in the flux-directing layer.

According to an aspect, there is provided a superconducting integrated circuit comprising a first device, the first device comprising at least a portion of a first metal layer within the superconducting integrated circuit, the first metal layer comprising a first superconducting material having a first critical temperature, a flux-trapping location spaced from the first device, the flux-trapping location positioned such that flux trapped within the flux-trapping location is isolated from the first device, and a flux-directing layer comprising a superconducting material having a second critical temperature, the flux-directing layer positioned in communication with the flux-trapping location, wherein the first critical temperature and the second critical temperature have a relative temperature difference, such that as the superconducting integrated circuit is cooled to a temperature that is less than both the first critical temperature and the second critical temperature, flux is directed away from the first device and into the flux-directing layer, and the flux-directing layer directs and traps flux within the flux-trapping location.

According to other aspects, the superconducting integrated circuit may further comprise a flux-trapping aperture at the flux-trapping location, the flux-trapping aperture may comprise one of a parallel-piped opening and a trough positioned within the superconducting integrated circuit, the superconducting integrated circuit may further comprise shielding that encloses the flux-trapping location, the shielding may comprise a plurality of superconducting stud vias, the flux-directing layer may comprise an opening aligned with the flux-trapping aperture, the first device may comprise one of a qubit and a coupler, the first metal layer may overlie at least a portion of the flux-directing layer, and the first critical temperature may be greater than the second critical temperature, the superconducting integrated circuit may further comprise a second metal layer positioned adjacent to the first metal layer, the second metal layer may comprise a shielding structure that shields the first device, and the second metal layer may comprise a superconducting material having a third critical temperature, the relative temperature difference between the second critical temperature and the third critical temperature may be selected to direct flux away from the first device and into the flux-trapping location, the first metal layer may overlie at least a portion of the flux-directing layer, and the second critical temperature may be less than the third critical temperature, the superconducting integrated circuit may further comprise one or more additional metal layers overlying at least a portion of the flux-directing layer, and a critical temperature of each additional metal layer may be greater than the second critical temperature, the critical temperatures of the first metal layer, the one or more additional metal layers, and the flux-directing layer may increase incrementally by layer from the flux-directing layer to an uppermost layer of the first metal layer and the one or more additional metal layers, the flux-directing layer may overlie at least a portion of the first metal layer, the superconducting integrated circuit may further comprise a second metal layer, the first metal layer may overlie at least a portion of the second metal layer, the second metal layer may comprise a shielding structure that shields the first device, the second metal layer may comprise a superconducting material having a third critical temperature, and may further comprise forming a base metal layer, the second metal layer may overlie the base metal layer, the third critical temperature may be greater than the critical temperature of the base metal layer, and the critical temperature of the base metal layer may be greater than the second critical temperature, the first critical temperature may be less than the second critical temperature, the flux-directing layer may comprise flux-trapping structures overlying at least a portion of the flux-trapping location, the flux-trapping structures may include at least one moat, the flux-trapping location may contain a second device, the second device may be a digital to analog converter, the flux-directing layer may comprise high kinetic inductance material and may further comprise at least one moat, at least 10% of the energy stored in the high kinetic inductance material may be stored as kinetic inductance, and a kinetic inductance fraction of the high kinetic inductance material may be $0.1 < \alpha \le 1$.

In other aspects, the features described above may be combined together in any reasonable combination as will be recognized by those skilled in the art.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and may have been solely selected for ease of recognition in the drawings.

Figure 7A:
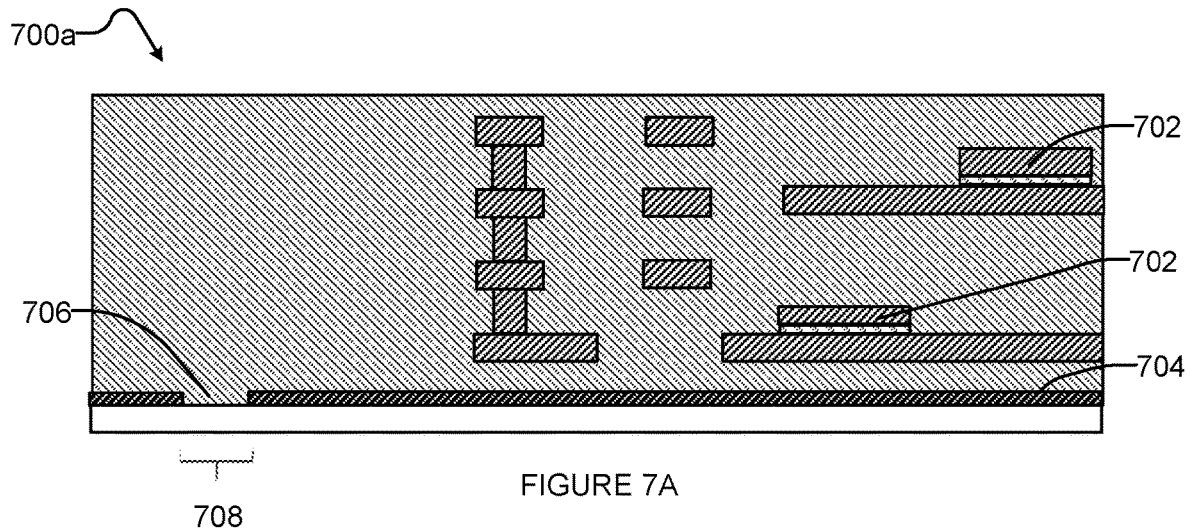
Figure 7B:
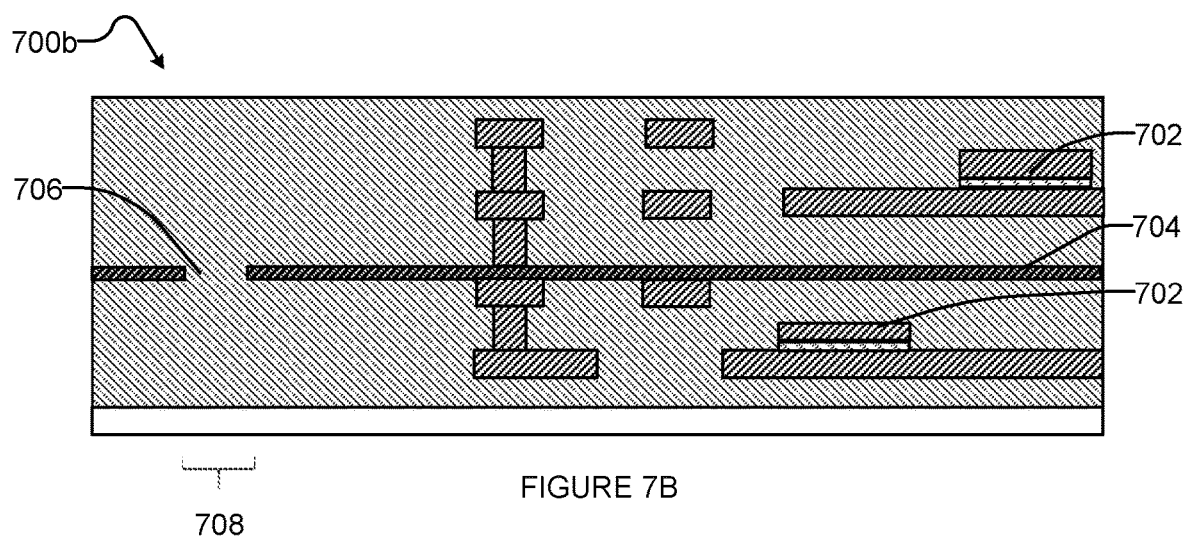
Figure 7C:
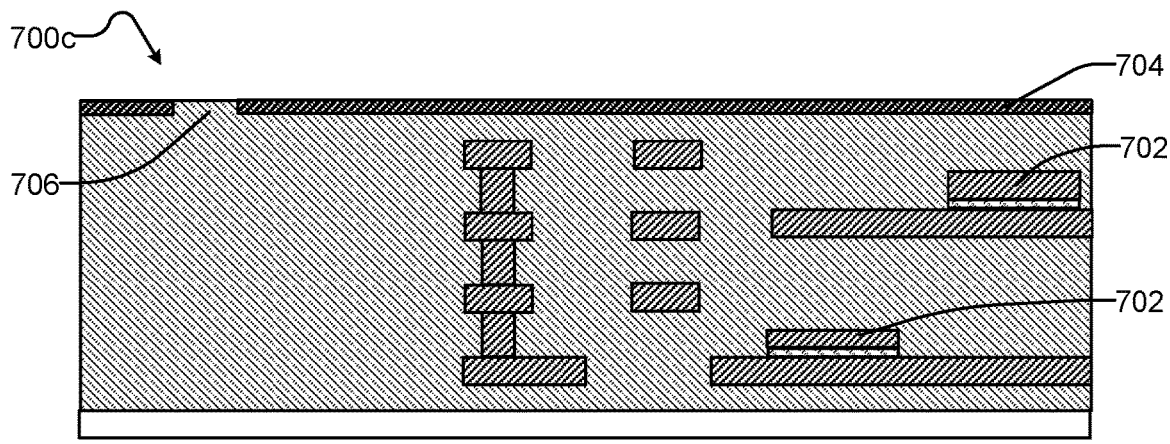

FIGS. 7A, 7B, and 7C are each a sectional view of a portion of a superconducting integrated circuit having a ground plane, shielding layer, and sky shield, respectively.

Figure 8:
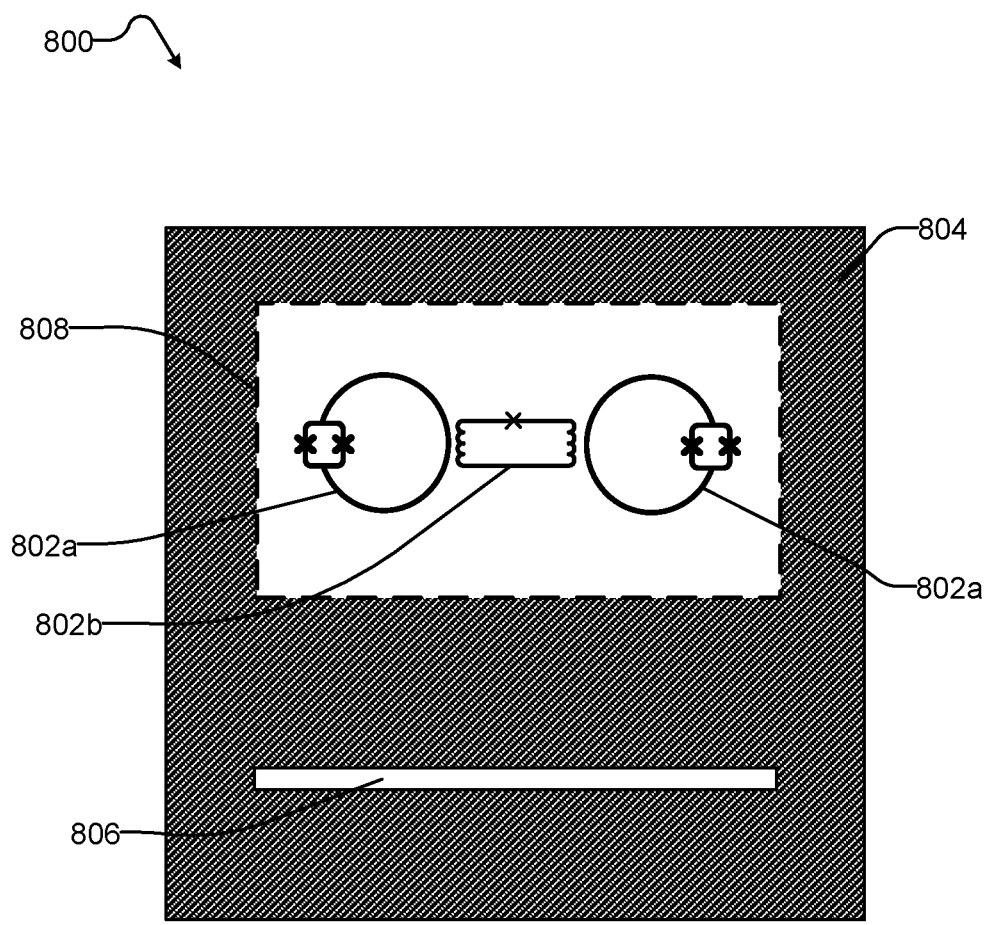

FIG. 8 is a top view of a representative superconducting circuit with a flux directing layer.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

A superconducting material experiences a transition to superconducting behavior at a critical temperature $T_c$. Above $T_c$, the material is non-superconducting, while below $T_c$ the material behaves as a superconductor. The critical temperature is also referred to in the present application as the transition temperature.

One of the properties of superconductors is that they expel interior magnetic fields. If there is an external magnetic field present as a superconducting integrated circuit is cooled through a critical temperature of a constituent superconducting material, magnetic flux may become trapped within the superconducting integrated circuit, as it can no longer pass through the superconducting material to reach other locations.

Flux trapping may, for example, occur at locations of defects or impurities in a constituent superconducting material of a superconducting integrated circuit, as well as at various structural features of a superconducting integrated circuit or constituent devices of a superconducting integrated circuit. For example, on a superconducting circuit having both superconducting and non-superconducting regions, the non-superconducting regions may become preferred places for flux to be trapped. Flux trapping may result from a cooldown dynamic of a particular structure or implementation of a superconducting integrated circuit or constituent devices of a superconducting integrated circuit.

Flux trapping may occur because, below $T_c$, flux is no longer able to migrate out of or through the superconductor, and as such, remains trapped within the superconducting integrated circuit. Trapped flux may contribute to noise within a superconducting integrated circuit. In addition, trapped flux may move the operating points of superconducting quantum interference devices and other on chip devices. It may be desirable to reduce trapped flux within a superconducting integrated circuit and/or to direct flux to safe pinning sites.

In order to form quantum computers having sufficiently large numbers of operating components to solve complex problems, it is necessary to employ multiple superconducting components in combination. In implementing groups of nominally identical devices at different locations within a superconducting integrated circuit, it may be necessary to implement on-chip control architecture to adjust individual components. For example, magnetic digital to analogue converters may be used to compensate for individual variations in operating points. However, trapped flux may cause flux offsets that are beyond what a digital to analogue converter is able to compensate, thereby rendering the device non-functional within the circuit.

External and/or on-chip magnetic shielding may be employed to reduce background magnetic fields during cooldown of a superconducting integrated circuit (see, for example, U.S. Pat. No. 8,441,330). This in turn reduces the amount of magnetic flux that is available to be trapped within the superconducting integrated circuit. However, as some background magnetic field typically remains (the remaining background magnetic field is also referred to in the present application as a residual magnetic field), and it is possible for elements on a superconducting integrated circuit to generate magnetic flux, external and/or on-chip shielding may not fully prevent flux trapping within integrated circuits. The resulting trapped magnetic flux may therefore be a source of noise within the superconducting integrated circuit. Further, the trapped flux may move the operating points of some superconducting devices, resulting in problematic flux offsets. As used herein "flux sensitive components" will refer both to components that are affected by noise within the superconducting integrated circuit generated by trapped flux, as well as those components that are affected by trapped flux shifting the operating points of these components.

It therefore may be beneficial to design superconducting integrated circuits including elements to reduce and/or prevent the influences of flux trapping on flux sensitive components of superconducting integrated circuits. Protective ground plane holes and moats (elongated holes or recesses) may be used in the design of superconducting integrated circuits to act as safe pinning sites for trapped flux. See, for example, Robertazzi et al. FLUX TRAPPING EXPERIMENTS IN SINGLE FLUX QUANTUM SHIFT REGISTERS, IEEE Trans. On Appl. Supercond., Vol. 7, pp. 3164-3167, June 1997.

As discussed above, magnetic flux may become trapped within a superconducting integrated circuit as a superconducting material in one or more constituent devices, traces, or other components of the superconducting integrated circuit is cooled through its critical temperature. Magnetic flux trapped within a superconducting integrated circuit may be a source of noise that introduces errors into a computational result from quantum annealing, for example. Magnetic flux trapped within a superconducting integrated circuit may also move the operating points of devices beyond the compensation limit of control devices, rendering the devices inoperable.

Magnetic flux trapping may be limited by shielding a superconducting integrated circuit from external magnetic fields. However, a residual external magnetic field, as well as induced magnetic fields from components of the superconducting integrated circuit, may still generate flux. The flux may cause noise, errors, and inoperable components, particularly should the flux become trapped near flux-susceptible superconducting devices or cause the operating points of these devices to move.

Throughout the present specification, the phrase "flux-susceptible superconducting device" is used to describe a superconducting device that is susceptible to noise and for which a noise-free operating environment is highly desirable for performance of a superconducting integrated circuit, for example, a quantum processor. "Flux-susceptible superconducting device" is also used to describe a superconducting device that is susceptible to having its operating point shifted by trapped flux, such as a qubit. It will be understood that the same device may be susceptible to both noise and shifting of its operating point. Poor performance of a flux-susceptible device may result in the quantum processor producing an inaccurate or suboptimal solution to a problem, for example, an inaccurate or suboptimal result of quantum annealing.

In some implementations, a superconducting integrated circuit includes a quantum processor, and the quantum processor includes a superconducting qubit. A qubit is an example of a superconducting device that may be considered a flux-susceptible device. Flux noise and flux trapping in proximity to a superconducting flux qubit may interfere with a performance of the quantum processor, for example, producing an inaccurate or suboptimal result, and/or producing a result that is a solution to a different problem than the one programmed.

In some implementations, a superconducting integrated circuit includes a magnetometer. A magnetometer is a device used to measure magnetic flux. A magnetometer in a quantum processor may be used to measure residual magnetic flux from external magnetic fields, as well as induced magnetic flux from components of the quantum processor. Flux noise in a magnetometer may cause little or no degradation of performance of the quantum processor. Thus, in the present specification, a magnetometer is an example of a device that may be described as less susceptible or not susceptible to noise or flux. Another example of a device that may be described as less susceptible or not susceptible to noise is a digital to analog converter (DAC). Note that the phrases "noise-susceptible" and "susceptible to noise" do not necessarily suggest that the device itself is physically more or less sensitive to noise compared to other devices that are not described as noise-susceptible. Instead, "noise-susceptible" is used to refer to the sensitivity of processor performance to flux noise within a given device. The sensitivity of the processor performance to flux noise is higher in noise-susceptible devices than in devices that are described as less susceptible to noise. Further, devices that are less susceptible to noise are also less susceptible to shifting of their operating points due to trapped flux.

One approach to reducing the impact of trapped magnetic flux on the operation of a superconducting integrated circuit is to configure the circuit to provide locations in which flux may be trapped that are away from any flux-susceptible superconducting devices. These locations are also referred to in the present application as safe (or safer) pinning sites for trapped flux.

A path of travel for magnetic flux may be incorporated into the superconducting integrated circuit that draws flux away from flux-susceptible superconducting devices during cooldown, and into safe pinning sites for trapped flux. As the path of travel of magnetic flux through the superconducting integrated circuit during cooldown will be dependent on the critical temperature of each superconducting layer, superconducting materials may be selected that provide a favorable progression of critical temperatures as the superconducting integrated circuit is cooled.

Current flowing through a metal material stores energy both in the magnetic field of that metal and in the kinetic energy of the charge carriers (e.g., the electrons or Cooper pairs). In non-superconducting metals, the charge carriers collide frequently with the lattice and lose their kinetic energy as Joule heating. This is also referred to as scattering, and quickly releases energy. In superconducting materials, scattering is substantially reduced, as the charge carriers are Cooper pairs which are protected against dissipation through scattering. This allows for superconducting materials to store energy in the form of kinetic inductance. This phenomenon allows kinetic inductance to efficiently store energy within the superconducting metal. Kinetic inductance is at least in part determined by the inertial mass of the charge carriers of a given material and increases as carrier density decreases. As the carrier density decreases, a smaller number of carriers must have a proportionally greater velocity in order to produce the same current. Materials that have high kinetic inductance for a given area (as defined below) are referred to as "kinetic inductance materials", or "high kinetic inductance materials".

Kinetic inductance materials are those that have a high normal-state resistivity and/or a small superconducting energy gap, resulting in a larger kinetic inductance per unit of area. In general, total inductance L of a superconducting material is given by $L=L_K+L_G$, where $L_G$ is the geometric inductance and $L_K$ is the kinetic inductance. The kinetic inductance of a superconducting film in near-zero temperatures is proportional to the effective penetration depth $\lambda_{eff}$. In particular, for a film with a given thickness t, the kinetic inductance of the film is proportional to the ratio of the width of the film W to the length of the film L, where length is in the direction of the current and width is orthogonal to length (note that both width and length are orthogonal to the dimension in which thickness is measured). That is, $$L_K \sim \lambda_{eff} \frac{L}{W}$$

for a superconducting film with a given thickness. The kinetic inductance fraction of a material is characterized as $$\alpha = \frac{L_k}{L_g + L_k}.$$

A material considered to have high kinetic inductance would typically have a in the range of $0.1 < \alpha \leq 1$. Materials with less than 10% of the energy stored as kinetic inductance would be considered traditional magnetic storage inductors with a small correction.

A superconducting integrated circuit may be cooled by a refrigerator. The refrigerator may be, for example, a dilution refrigerator and/or a cryocooler, such as a pulse tube cryocooler, also referred to in the present application as a pulse tube refrigerator. A superconducting integrated circuit may be cooled to a temperature below 1K. In some implementations, the superconducting integrated circuit is cooled to below 20 mK. In some implementations, the superconducting integrated circuit and the refrigerator are elements of a superconducting computer. In some implementations, the superconducting computer is a superconducting quantum computer.

Figure 1:
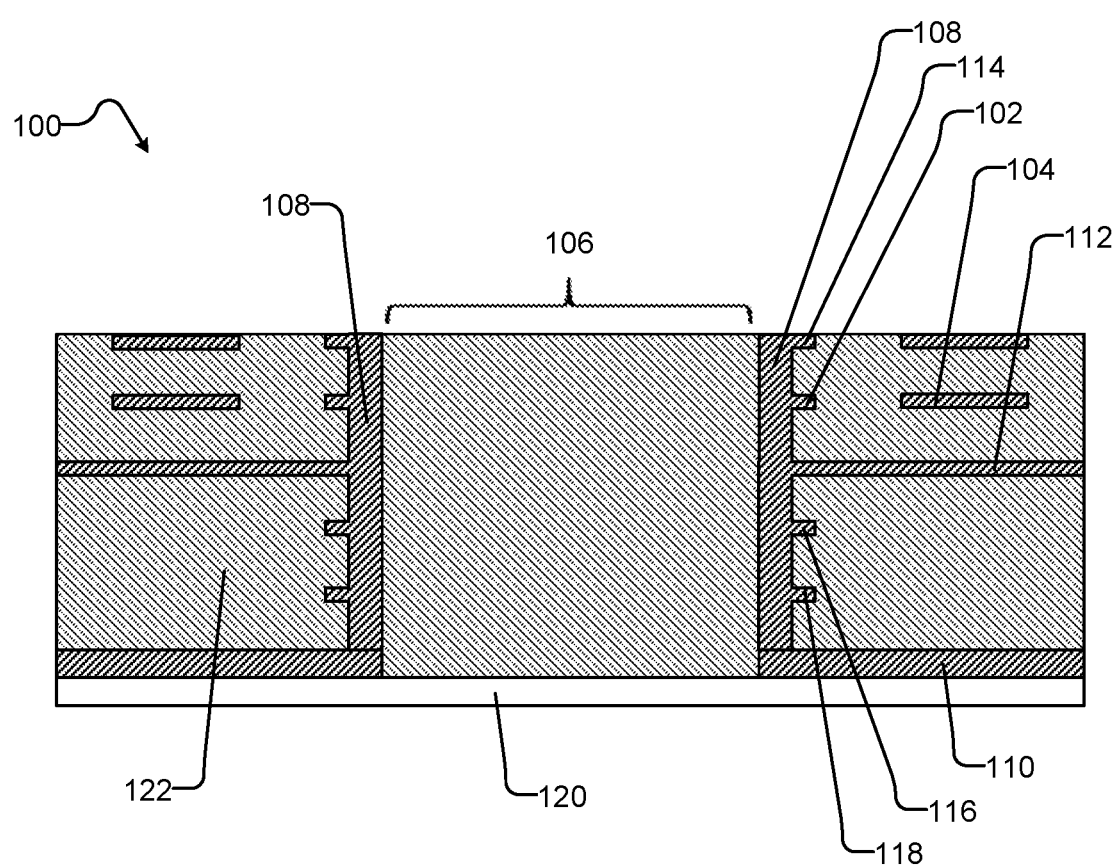
FIG. 1 is a sectional view of a portion of a superconducting integrated circuit.
Figure 5:
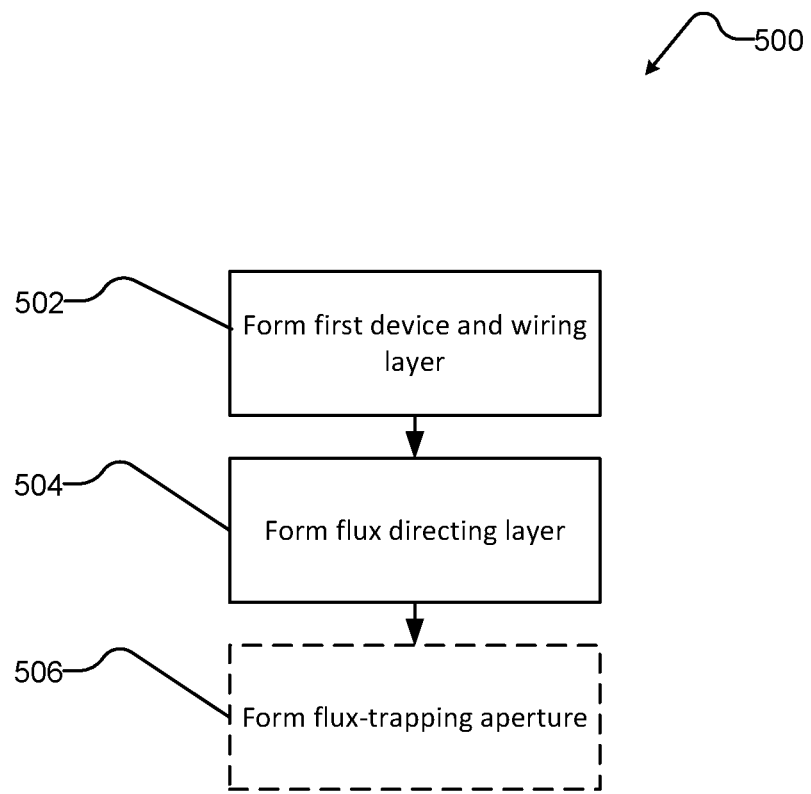
FIG. 5 is a flowchart illustrating a method for mitigating flux trapping in a superconducting integrated circuit.

FIG. 1 shows a sectional view of a portion of an example implementation of a superconducting integrated circuit 100, fabricated according to method 500 of FIG. 5. See below for a description of method 500 of FIG. 5.

Superconducting integrated circuit 100 includes a first metal layer 102 with a first device 104, first metal layer 102 being formed from a superconducting material having a first critical temperature $T_{C1}$. First device 104 may be a flux-susceptible superconducting device, as discussed above. For example, first device 104 may be a qubit or a coupler formed as part of superconducting integrated circuit 100. It will be understood that the portion of wiring that is shown in FIG. 1 and indicated as first device 104 may form only part of first device 104, which may have other components in other portions of superconducting integrated circuit 100 and may also extend into other layers of superconducting integrated circuit 100. The term "device" will be used throughout the specification in this manner, and it will be understood that only a portion of the device may be indicated in the figures. In the particular implementation shown in FIG. 1, device 104 may be a portion of the body of a qubit or coupler.

A flux-trapping location, such as aperture 106 in the example implementation of FIG. 1, is selected as a location within superconducting integrated circuit 100 that is a favorable or "safe" location for trapping flux. In a preferred implementation, the flux-trapping location in the form of aperture 106 is a series of contiguous openings fabricated intentionally through the superconducting material, such that an opening is provided in each superconducting layer, and such that the openings are aligned or connected through the entire superconducting integrated circuit. Aperture 106 is spaced apart from first device 104. Aperture 106 is positioned such that flux will preferentially be trapped within aperture 106 as superconducting integrated circuit 100 is cooled, and such that flux trapped within aperture 106 is isolated from first device 104.

In the present specification, the term "isolated" is used to refer to a spacing or configuration that prevents flux trapped within an aperture from having a sufficient influence on a flux-susceptible device to cause errors. It will be understood that the tolerance for errors will depend on the sensitivity of the flux-susceptible device, as well as the configuration of the superconducting integrated circuit. As such, "isolated" refers to a spacing or configuration where the coupling between the trapped flux and the flux-susceptible device is sufficiently small as to not affect the operation of the circuit elements.

In some implementations aperture 106 may be a box-shaped opening or recess formed in superconducting integrated circuit 100, or a trough positioned through a portion of superconducting integrated circuit 100. In some implementations it may be beneficial to provide aperture 106 in the form of a spiral opening or recess in order to provide a large surface area for aperture 106.

While the example implementation of FIG. 1 shows an aperture 106 formed in superconducting integrated circuit 100 to act as the flux-trapping location, it will be understood that the flux-trapping location may also be a component or area of superconducting integrated circuit 100 that is not flux-susceptible. For example, the flux-trapping location may be a joint or seam within integrated circuit 100 that is positioned away from flux-susceptible devices or may be an empty area of superconducting integrated circuit 100 that is spaced from flux-susceptible devices. Flux-trapping location in the form of aperture 106 is preferably a series of aligned openings in each superconducting layer that extend through the entire superconducting integrated circuit.

In some instances, shielding may be provided to enclose the flux-trapping location. As is shown in FIG. 1, shielding 108 may be provided to enclose aperture 106. Shielding 108 may beneficially be formed from a layer of superconducting material of sufficient thickness that magnetic flux trapped in aperture 106 does not penetrate through shielding 108 to reach first device 104. In some implementations, shielding 108 may be formed from a plurality of superconducting stud vias that are formed through layers of integrated circuit 100 in order to provide a barrier around aperture 106.

Superconducting integrated circuit 100 includes a flux-directing layer 110 formed from a superconducting material having a second critical temperature $T_{C2}$. In some implementations, flux-directing layer 110 is positioned in flux-transmitting communication with aperture 106. As used herein, flux-transmitting communication refers to sufficient physical proximity and arrangement that flux may be transmitted from the flux-directing layer to the flux-trapping location, although it will be understood that the flux-directing layer and the flux-trapping location may not be in contact and may not be immediately adjacent. In the example implementation of FIG. 1, flux directing layer 110 is a base layer of superconducting integrated circuit 100. In some implementations, aperture 106 may be formed through a portion of flux-directing layer 110.

In some implementations, the materials of first metal layer 102 and flux-directing layer 110 are selected such that first critical temperature $T_{C1}$ and second critical temperature $T_{C2}$ have a relative temperature difference. In these implementations, first metal layer 102 and the flux-directing layer 110 reach their critical temperatures at different stages during the cooling process (also referred to in the present application as the cooldown).

As superconducting integrated circuit 100 is cooled to a temperature that is less than both first critical temperature $T_{C1}$ and second critical temperature $T_{C2}$, magnetic flux is directed away from first device 104 and into flux-directing layer 110, and the flux-directing layer 110 directs and traps magnetic flux within aperture 106, as will be discussed further below.

In the implementation shown in FIG. 1, first metal layer 102 overlies at least a portion of flux-directing layer 110. In one implementation, the relative critical temperatures may be selected with first critical temperature $T_{C1}$ being greater than second critical temperature $T_{C2}$.

In some implementations, superconducting integrated circuit 100 includes a second metal layer 112 positioned adjacent to first metal layer 104. In some implementations, second metal layer 112 provides an on-chip shielding structure to shield first device 104 from magnetic fields. In some implementations, the on-chip shielding structure may govern the flux behavior of the device it shields. That is, the on-chip shield may direct flux away from the first device 104 as the first device 104 passes through its critical temperature, allowing the critical temperature of the first device to become less relevant to flux trapping. It will also be understood that, while one is provided in the example implementation of FIG. 1, there is no requirement for an on-chip shield to be provided as shown. First wiring layer 102 may include flux directing structures, or the nature of first device 104 may be such that the first device 104 can direct flux to be controlled by flux-directing layer 110 without the assistance of second metal layer 112.

On-chip shielding, for example, shielding provided by a layer of superconducting metal near a flux-susceptible superconducting device is described further in U.S. Pat. Nos. 7,687,938 and 8,247,799.

Second metal layer 112 may be formed from a superconducting material having a third critical temperature $T_{C3}$. A relative temperature difference between second critical temperature $T_{C2}$ and third critical temperature $T_{C3}$ may be selected to direct flux away from first device 104 and into flux-directing layer 110.

One or more additional metal layers (for example, metal layers 114, 116, and 118) may be included in superconducting integrated circuit 100, each additional metal layer overlying at least a portion of flux-directing layer 110, and the critical temperature of each additional metal layer (for example each of metal layers 114, 116, 118) being greater than second critical temperature $T_{C2}$. Additional metal layers 114, 116, and 118 may also contain flux-susceptible superconducting devices.

In some implementations, the critical temperatures may be selected to increase incrementally by layer from the lower layer to the upper layer in superconducting integrated circuit 100 (i.e., from a base layer also referred to in the present application as flux-directing layer 110 to uppermost metal layer 114).

In the implementation shown in FIG. 1, the respective critical temperatures may be selected such that the cooling process proceeds first with additional metal layer 114, which has the highest critical temperature and transitions to superconducting first, pushing flux into aperture 106 and lower metal layers (for example first metal layer 102). The next layer to transition is first metal layer 102, and then shielding layer 112, additional layers 116 and 118, and finally base layer 110, which also acts as flux-directing layer 110.

Flux-directing layer 110 directs remaining flux, which has been successively pushed lower into flux directing layer 110, to aperture 106, where the flux is isolated from first device 104. As discussed above, aperture 106 may be a location in flux-directing layer 110 where flux is isolated from first device 104 and may also have shielding 108.

In some implementations, superconducting integrated circuit 100 is formed from a single superconducting material, which in some implementations may, for example, be niobium or aluminum. Different layers of the single superconducting material may have different critical temperatures as a result of processing during formation of superconducting integrated circuit 100, for example, during multiple deposition stages in forming superconducting integrated circuit 100. One cause of this change in critical temperature is oxidation during processing, which may, for example, have the effect of lowering the critical temperature of niobium.

FIG. 1 has superconducting integrated circuit 100 formed on a substrate layer 120. It will be understood that superconducting integrated circuit 100 may also be placed over other structures such as other wiring layers and/or dielectric layers. In some implementations, substrate 120 may be formed of silicon or sapphire.

FIG. 1 also has the components of superconducting integrated circuit 100 surrounded by a dielectric material 122. Dielectric material may, for example, be $SiO_2$, SiN, or any other suitable dielectric material as is known in the art.

The sequence in which different wiring layers in superconducting integrated circuits pass through their respective critical temperatures when cooling may influence the location of trapped flux. In some implementations, a favorable arrangement of wiring layer critical temperatures within a superconducting integrated circuit may beneficially result in less flux trapped near flux-susceptible superconducting devices.

In the case of the implementation shown in FIG. 1, the general pattern of flux movement will be driven by layers 114, 112, and 110. In a first stage of a cooldown, layer 114 (having the highest critical temperature of the layers shown in FIG. 1) is the first to expel flux. In a second stage of the cooldown, shielding layer 112 is the next layer to expel flux. Shielding layer 112 moves flux away from first device 104, and passes flux through the superconducting integrated circuit, for example through walls (for example wall 108) between layer 114 and layer 112. In a later stage of the cooldown, flux-directing layer 110 forces magnetic flux into flux-trapping locations in superconducting integrated circuit 100, which may trap flux away from first device 104 and other flux-susceptible superconducting devices. These locations may be near other devices that are not flux-susceptible, such as digital to analog converters (DACs) and/or magnetometers. These locations may preferably be an aperture 106.

In an alternative implementation of the design shown in FIG. 1, the critical temperatures of the layers may be arranged such that $T_{C2}$ is greater than the other critical temperatures found in superconducting integrated circuit 100, and, in particular, is greater than $T_{C1}$. In this implementation, flux-directing layer 110 will transition to be superconducting prior to first metal layer 102. Flux-directing layer will direct flux into aperture 106, moving flux away from flux-sensitive device 104. As the remaining levels transition to be superconducting, the flux will be directed into aperture 106. In this implementation, allowing the layer that does not contain flux-sensitive device 104 to become superconducting first allows for the flux-directing layer to govern the flux trapping behavior and for the flux to be moved away from these sensitive devices prior to the layer containing the sensitive devices becoming superconducting. Generally, similar circuits may be designed where any layer that contains a flux-sensitive device has a $T_c$ that is lower than that of provided flux-directing layers. This allows the layers that contain flux-sensitive devices to pass through their critical temperatures in an environment that is already free of magnetic flux, due to the direction of the flux by the flux directing layers.

Figure 2A:
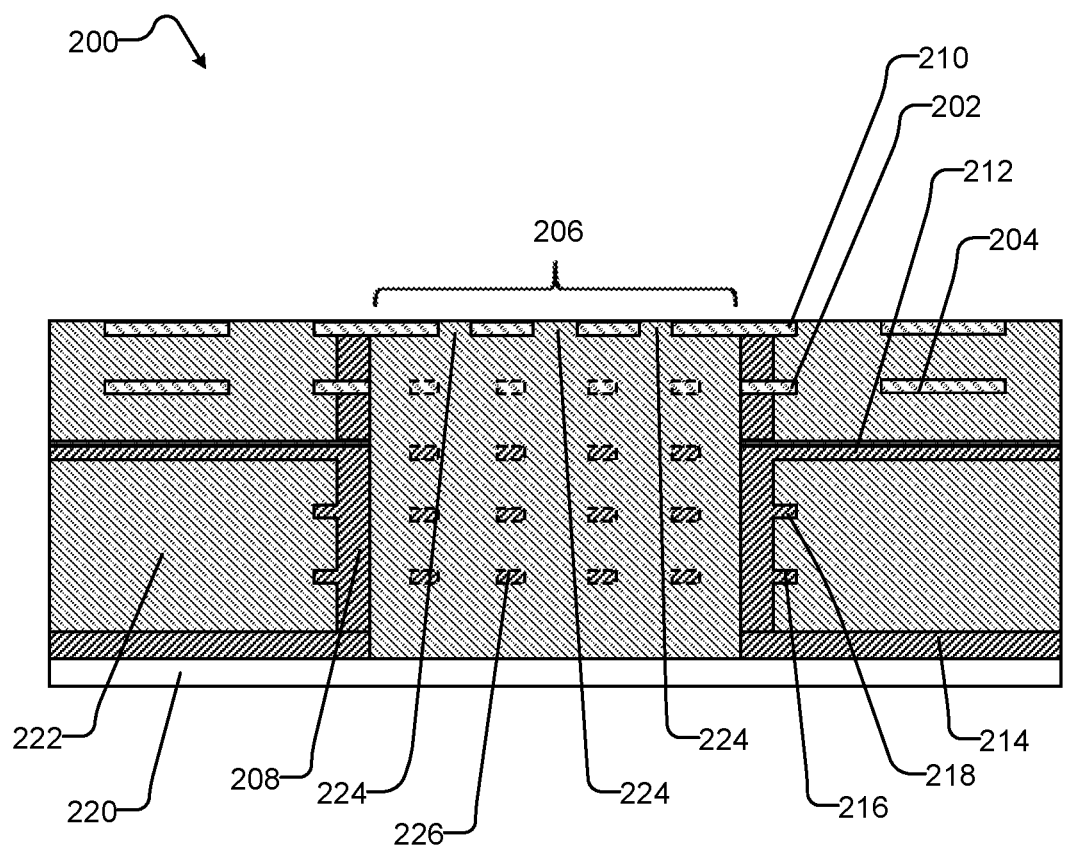
FIGS. 2A and 2B are sectional views of a portion of an alternative superconducting integrated circuit having hybrid materials.

FIG. 2A shows a sectional view of a portion of superconducting integrated circuit 100 of FIG. 1, fabricated according to an alternate implementation of method 500 of FIG. 5.

Superconducting integrated circuit 200 includes a first metal layer 202 with a first device 204, first metal layer 202 being formed from a superconducting material having a first critical temperature $T_{C1}$. First device 204 may be a flux-susceptible superconducting device, as discussed above. For example, first device 204 may be a qubit or a coupler formed as part of superconducting integrated circuit 200.

A flux-directing layer 210 formed from a superconducting material having a second critical temperature $T_{C2}$ is provided in integrated circuit 200. In the implementation of in FIG. 2A, flux-directing layer 210 is an upper layer of superconducting integrated circuit 200. Flux-directing layer 210 is provided with flux-trapping structures 224 overlying at least a portion of an aperture 206.

In the example implementation of FIG. 2, flux-trapping structures 224 are a series of moats provided in flux-directing layer 210. Moats are preferably formed as a single contorted or convoluted (e.g., serpentine) moat formed in flux-directing layer 210. Moats may also be provided by small gaps or cuts in a superconducting metal layer and may be employed in order to trap flux.

Aperture 206 is selected as a location within integrated circuit 200 that is spaced apart from first device 204 such that flux trapped within aperture 206 is isolated from first device 204. Flux-trapping structures 224 are arranged to overlie and direct flux into aperture 206 as superconducting integrated circuit 200 is cooled. In some implementations, aperture 206 may be in the form of a box, a parallel-piped, a trough, or a spiral formed in superconducting integrated circuit 200.

Flux-directing layer 210 overlies at least a portion of first metal layer 202, and superconducting integrated circuit 200 is provided with a second metal layer 212 positioned adjacent to first metal layer 202, with second metal layer 212 acting as an on-chip shield to shield first device 204. Shielding layer 212 may at least partially control the flux behavior that affects first device 204. Second metal layer 212 may be formed from a superconducting material having a critical temperature $T_{C3}$ that is greater than the critical temperature of flux-directing layer 210. During cooling of superconducting integrated circuit 200, second metal layer 212 directs flux away from first device 204 and into flux-directing layer 210. As flux-directing layer 210 is cooled through its critical temperature $T_{C2}$, flux-trapping structures 224 may serve to trap magnetic flux within aperture 206.

A base metal layer 214 may also be included in superconducting integrated circuit 200 and may have a critical temperature $T_{C4}$ that is greater than critical temperature $T_{C2}$ of flux-directing layer 210, and less than the critical temperature $T_{C3}$ of second metal layer 212. In this implementation, flux may first be pushed out of second metal layer 212 as superconducting integrated circuit 200 is cooled. Flux may subsequently be pushed into base metal layer 214, and then finally into flux directing layer 210. In this implementation, the relationship of critical temperatures will be $T_{C3} > T_{C4} > T_{C2}$.

Superconducting materials of superconducting integrated circuit 200 may be selected to create a desired relationship between critical temperatures (such as the relationship described above). Different materials may be used for forming the superconducting portions of superconducting integrated circuit 200. For example, a hybrid stack approach may be used, as described in U.S. Provisional Patent Application No. 62/760,253.

In one implementation, lower layers 214, 216, and 218 of superconducting integrated circuit 200 may be formed from niobium, which has a critical temperature of approximately 9.3 K. Upper layers 210 and 202 may be formed from aluminum, which has a critical temperature of approximately 1.2 K.

Base layer 214 may also be formed from a lower critical temperature niobium to ensure that layer 212 becomes superconducting prior to base layer 214. This may, for example, be achieved through intentional oxidation of the niobium during formation of superconducting integrated circuit 200.

It will be understood that the example implementation shown in FIG. 2A may be modified to contain different numbers of materials on different layers. In one implementation, three different materials may be used to form superconducting integrated circuit 200. In another implementation, one or more layers of superconducting integrated circuit 200 may be selected to have a kinetic inductance that allow for control over the location where flux is likely to be trapped and/or may reduce coupling to the surrounding structure. In some implementations, one or more layers may be a high kinetic inductance material, as will be discussed in further detail below.

Shielding 208 may be provided to isolate the flux-trapping location, such as aperture 206 from first device 204. Shielding 208 may beneficially be formed from a layer of superconducting material having sufficient thickness that magnetic flux trapped in aperture 206 does not penetrate through shielding 208 to reach first device 204. In some implementations, shielding 208 may be formed from a plurality of superconducting stud vias that are formed through various layers of integrated circuit 200 in order to provide a barrier around aperture 206.

Referring to FIG. 2A, in some implementations aperture 206 may contain a second device 226 that is not a flux-susceptible superconducting device. This may be beneficial to increase the circuit density of superconducting integrated circuit 100. Second device 226 may be, for example, a digital to analog converter (DAC) spiral or a magnetometer.

FIG. 2A has superconducting integrated circuit 200 formed on a substrate layer 220. It will be understood that superconducting integrated circuit 200 may also be placed over other structures such as other wiring layers and/or dielectric layers. In some implementations, substrate 220 may be formed of silicon or sapphire.

FIG. 2A also has the components of superconducting integrated circuit 200 surrounded by a dielectric material 222. Dielectric material may, for example, be $SiO_2$, or any other suitable dielectric material as is known in the art.

In some implementations, such as the one shown in FIG. 2A, flux trapping may be controlled by design. In particular, the flux-trapping mechanism may rely on a sequence of descending critical temperatures during cooldown, where shielding layer 212 becomes superconducting first, base layer 214 becomes superconducting second, and top layer 210 becomes superconducting third ($T_{C3} > T_{C4} > T_{C2}$).

In some implementations it may be beneficial to form shielding layer 212 as a contiguous layer to form a ground plane beneath any flux-susceptible superconducting devices, such as qubits or couplers. Shielding layer 212 then passes through critical temperature $T_{C3}$ and becomes superconducting, expelling flux into holes in shielding layer 212 of superconducting integrated circuit 200, such as aperture 206. Base layer 214 will then transition through its critical temperature, trapping flux within the holes in shielding layer 212.

Upper layer 210, which acts as flux-directing layer 210 then transitions through its critical temperature $T_{C2}$, causing flux trapped within aperture 206 to become constrained within flux-trapping structures 224. In some implementations, flux-trapping structures 224 include at least one moat. As shown in FIG. 2A, it may be possible to have an optional non-flux susceptible device 226 within aperture 206. In the implementation shown in FIG. 2A, the hierarchy of critical temperatures has the critical temperature of the shielding layer 212 being greater than the critical temperature of the base layer 214, and the critical temperature of the base layer 214 being higher than the critical temperature of the flux directing layer 210 ($T_{C3} > T_{C4} > T_{C2}$).

Figure 2B:
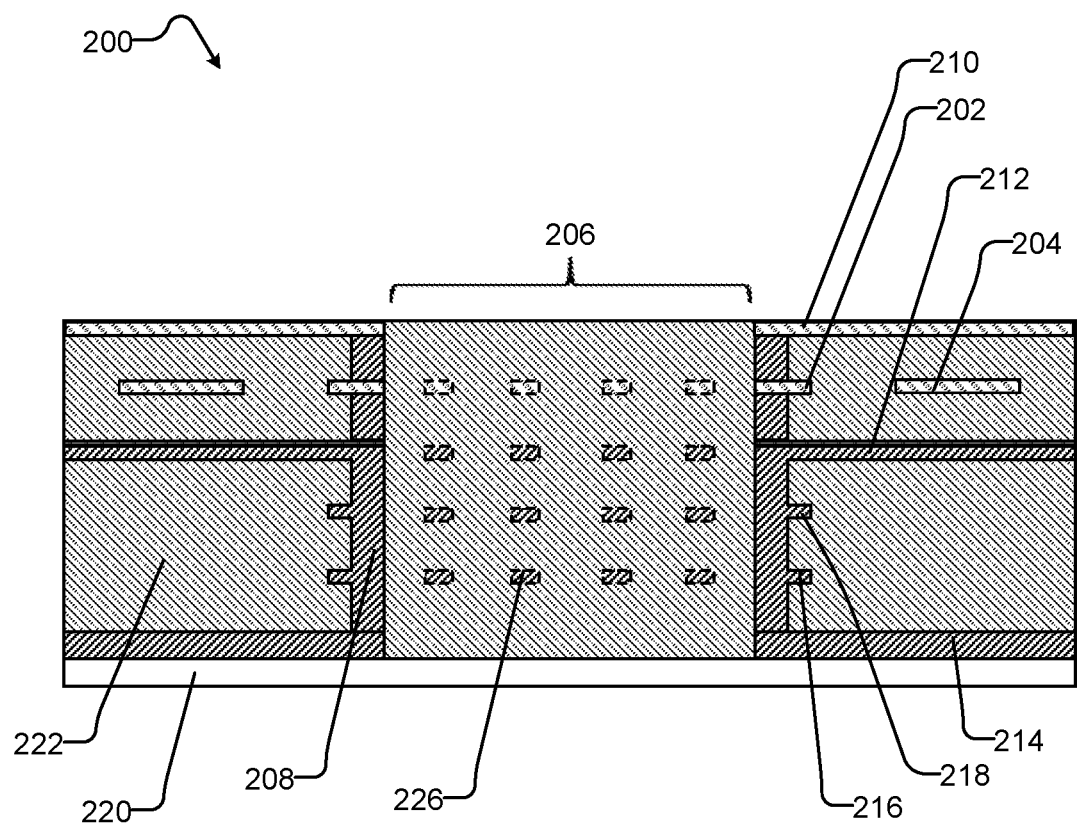

In some implementations, such as the one shown in FIG. 2B, the introduction of a second material, such as aluminum, into the fabrication of superconducting integrated circuit 100 of FIG. 1, may provide a more favorable flux-trapping mechanism, with or without flux-trapping structures 224 being present in flux-trapping layer 210.

During the cooling of superconducting integrated circuit 200 from $T_1$ to $T_2$, shielding layer 212 will pass through critical temperature $T_{C3}$ and become superconducting first, with flux being expelled from the shielding under first device 204, as well as other flux-susceptible superconducting devices that may be present. This may cause flux to be expelled into areas such as DAC plaquettes or other flux-trapping locations designed in superconducting integrated circuit 200. By providing aperture 206, flux is preferentially expelled into and trapped within aperture 206.

After these layers are cooled, the lower critical temperature material (for example the aluminum layers) may pass through their critical temperatures, causing flux to become trapped in cracks in the walls between shielding layer 212 and flux-trapping layer 210. This may provide a trapped flux configuration similar to that described for the implementation in FIG. 1, moving flux away from the flux-susceptible superconducting devices in superconducting integrated circuit 200. With similar hybrid material circuits, it may be sufficient to ensure that the shielding layer 212 has a critical temperature that is higher than that of lower layer 214. Aperture 206 is beneficially provided in a location to receive flux as it is expelled from these layers.

Figure 3A:
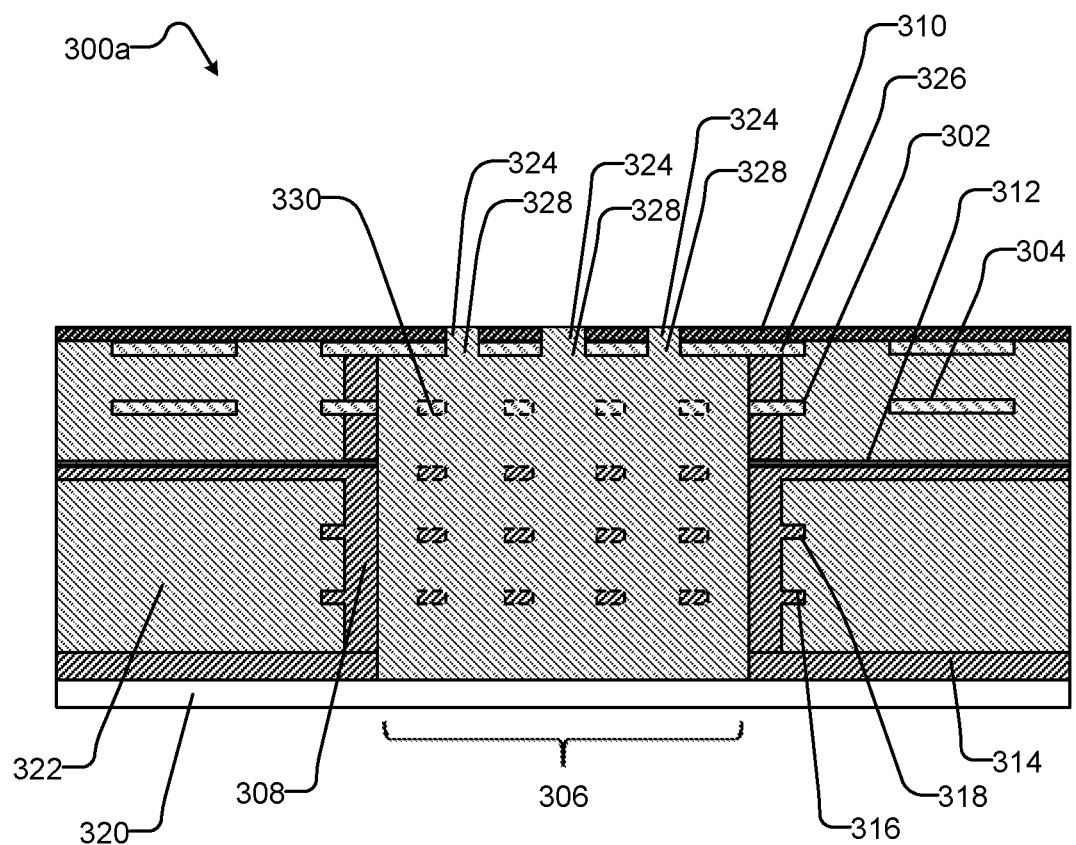
FIGS. 3A and 3B are each a respective sectional view of a portion of a superconducting integrated circuit having an upper, separate flux directing layer.
Figure 3B:
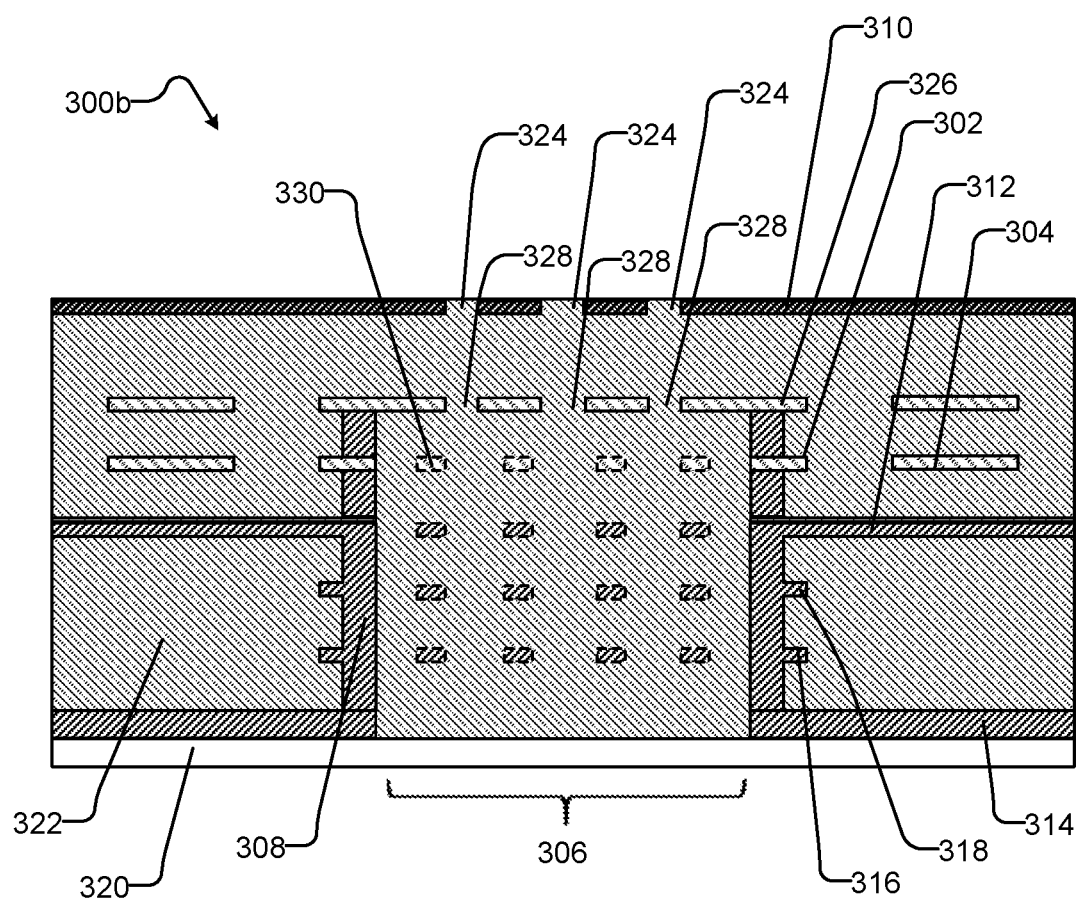

In some implementations, a separate superconducting layer, referred to in the present application as a sky shield, having a significantly higher critical temperature may be introduced into the superconducting integrated circuit as the flux-directing layer. FIGS. 3A and 3B show sectional views of a portion of a superconducting integrated circuit 300a and 300b, fabricated according to an alternate implementation of method 500 of FIG. 5.

Referring to FIG. 3A, superconducting integrated circuit 300a includes a first metal layer 302 with a first device 304, first metal layer 302 being formed from a superconducting material having a first critical temperature. First device 304 may be a flux-susceptible superconducting device, as discussed above. For example, first device 304 may be a qubit or a coupler formed as part of superconducting integrated circuit 300a.

A flux-directing layer 310 formed from a superconducting material having a second critical temperature $T_{C2}$ is provided in superconducting integrated circuit 300a. Flux-directing layer 310 is an upper layer of superconducting integrated circuit 300a and 300b. Flux-directing layer 310 may beneficially be placed overlying at least first metal layer 302, as well as any other layers containing flux-susceptible superconducting devices. Flux-directing layer 310 is provided with flux-trapping structures 324, such as moats as discussed above, overlying at least a portion of aperture 306. Flux-trapping structures 324 may be positioned to overlie aperture 306, and to direct flux into aperture 306 as superconducting integrated circuit 300a is cooled. Flux trapped within aperture 306 is isolated from first device 304.

In some implementations, aperture 306 may be in the form of a box, parallel-piped, a trough, or a spiral formed in superconducting integrated circuit 300a. Flux-directing layer 310 overlies at least a portion of first metal layer 302. Superconducting integrated circuit 300 includes a second metal layer 312 positioned adjacent to first metal layer 302, with second metal layer 312 acting as an on-chip shield to shield first device 304 and control flux behavior that may affect first device 304, as discussed above.

In some implementations, flux-directing layer 310 is a sky shield that is placed across the entire superconducting integrated circuit 300a and is formed from a material having a substantially higher critical temperature than other superconducting materials that form superconducting integrated circuit 300a. For example, flux-directing layer 310 may be formed from $Nb_3Sn$, which has a critical temperature of approximately 15 K. In other implementations, flux-directing layer 310 may be formed from a high kinetic inductance material having a higher critical temperature, as discussed in further detail below. In this case, flux-trapping structures 324 (which may, for example, be moats) may be patterned into flux-directing layer 310 to corral flux found in superconducting integrated circuit 300a into aperture 306. The corralling of flux into aperture 306 may occur prior to the lower layers of superconducting integrated circuit 300a being cooled through their critical temperatures ($T_{C1}$, $T_{C3}$) and becoming superconducting. This may allow the remaining layers to pass through their critical temperatures in an environment free of flux.

Once flux-directing layer 310 has passed through its critical temperature and expelled flux into flux-trapping structures 324, it is highly likely that any flux remaining in upper wiring layer 326 will be guided into moats 328 that are also formed in an upper wiring layer 326, independent of the critical temperature sequence of the remaining layers of superconducting integrated circuit 300a. Employing a separate flux-directing layer having a significantly higher critical temperature than other wiring layers of superconducting integrated circuit 300a may serve to prevent flux-trapping during cooling of the lower layers of superconducting integrated circuit 300a.

In some implementations, fabrication of superconducting integrated circuit 300a includes a hybrid stack approach, as discussed above, although the critical temperatures of various layers of superconducting integrated circuit 300a may have less effect on the pattern of flux trapping. Superconducting integrated circuit 300a may be provided with second metal layer 312 that directs flux away from first device 304 as discussed above. Base metal layer 314 may be formed from the same material as second metal layer 312 or may be fabricated to have a lower critical temperature.

Shielding 308 may be provided to enclose a region below flux-trapping structures 324. Shielding 308 may be arranged such that magnetic flux trapped in aperture 306 does not penetrate through shielding 308 to reach first device 304. In some implementations, shielding 308 may be formed from a plurality of superconducting stud vias that are formed through the layers of integrated circuit 300 in order to provide a barrier around aperture 306. In some implementations, it may be beneficial to form shielding 308 as a plurality of superconducting stud vias that are at least as thick or thicker than three times the London penetration depth of the superconducting material selected to form the stud vias.

Aperture 306 may contain a second device 330 that is not a flux-susceptible superconducting device. This may be beneficial to increase the circuit density of superconducting integrated circuit 300a, although in some implementations it is beneficial to leave aperture 306 empty. Second device 330 may be, for example, a digital to analog converter (DAC) spiral or a magnetometer.

FIG. 3A has superconducting integrated circuit 300a formed on a substrate layer 320. It will be understood that superconducting integrated circuit 300a may also be placed over other structures such as other wiring layers and/or dielectric layers. In some implementations, substrate 320 may be formed of silicon or sapphire. FIG. 3A also has the components of superconducting integrated circuit 300a surrounded by a dielectric material 322. Dielectric material may, for example, be $SiO_2$, or any other suitable dielectric material as is known in the art.

In the implementation shown in FIG. 3B, superconducting integrated circuit 300b is the same in structure as superconducting integrated circuit 300a of FIG. 3A ($T_{C2}>T_{C3}, T_{C1}$), with the exception of the spacing between flux directing layer 310 and upper wiring layer 326. When flux-directing layer 310 and upper wiring layer 326 are spaced apart from each other, a layer of dielectric material 322 may be provided between the layers. In some implementations, it may be beneficial to separate flux-directing layer 310 from other elements of superconducting integrated circuit 300b by providing a layer of dielectric that has sufficient thickness to minimize, or at least reduce, the amount to which it may increase the qubit and coupler capacitances. In some implementations, the thickness of the interlayer dielectric between the separate flux-directing layer 310 and the topmost metal layer of rest of the superconducting integrated circuit 300b may be proportional to the width of flux-trapping structures 324. In implementations where flux-trapping structures 324 take the form of moats, the thickness of the dielectric may be proportional to $1/w^3$, where w is the width of the moat in the flux-directing layer. It will be understood that the required thickness may also depend on the materials used to form the circuit, the type of devices formed in the layers, and the amount of flux within the circuit.

In various of the implementations discussed above, flux trapping is minimized, or at least reduced, and controlled by the method of fabrication of the superconducting integrated circuit to include flux-trapping locations. Flux trapping in a superconducting integrated circuit may be minimized, or at least reduced, by fabricating the superconducting integrated circuit using material with a hierarchy of transition temperatures and directing flux to areas of the superconducting integrated circuit less likely to be affected by trapped flux.

The critical temperature of each layer in a superconducting integrated circuit may be controlled by material selection or by treatments applied to the material. Treatments applied to the material may include treatments arising from subsequent processing of the superconducting integrated circuit during fabrication.

One example of a treatment that has been found to impact the critical temperature of niobium layers is oxidation that may occur during fabrication of the superconducting integrated circuit. Oxidation may be used to influence the critical temperatures of metal layers in the superconducting integrated circuit, and thereby the pattern of flux trapping. Specific structures may also be provided, such as a moat or moats, which may, for example, be provided by a single contorted moat structure, or by narrow gaps between strips of superconductor or narrow cuts made into the superconductor. A moat may be used to trap flux at a location where flux will not cause errors, or will cause fewer errors, in flux-susceptible superconducting devices of the superconducting integrated circuit.

One example of material selection includes the selection of a high kinetic inductance superconducting material. Superconducting materials having high kinetic inductance may also have a high critical temperature ($T_c$). A high kinetic inductance material may be defined as a material where at least 10% of the energy stored in the high kinetic inductance material is stored as kinetic inductance, or where the kinetic inductance fraction of the high kinetic inductance material is $0.1<\alpha \le 1$. In some implementations, the high kinetic inductance material may be one of WSi, MoN, NbN, NbTiN, TiN, and granular Aluminum.

Figure 4:
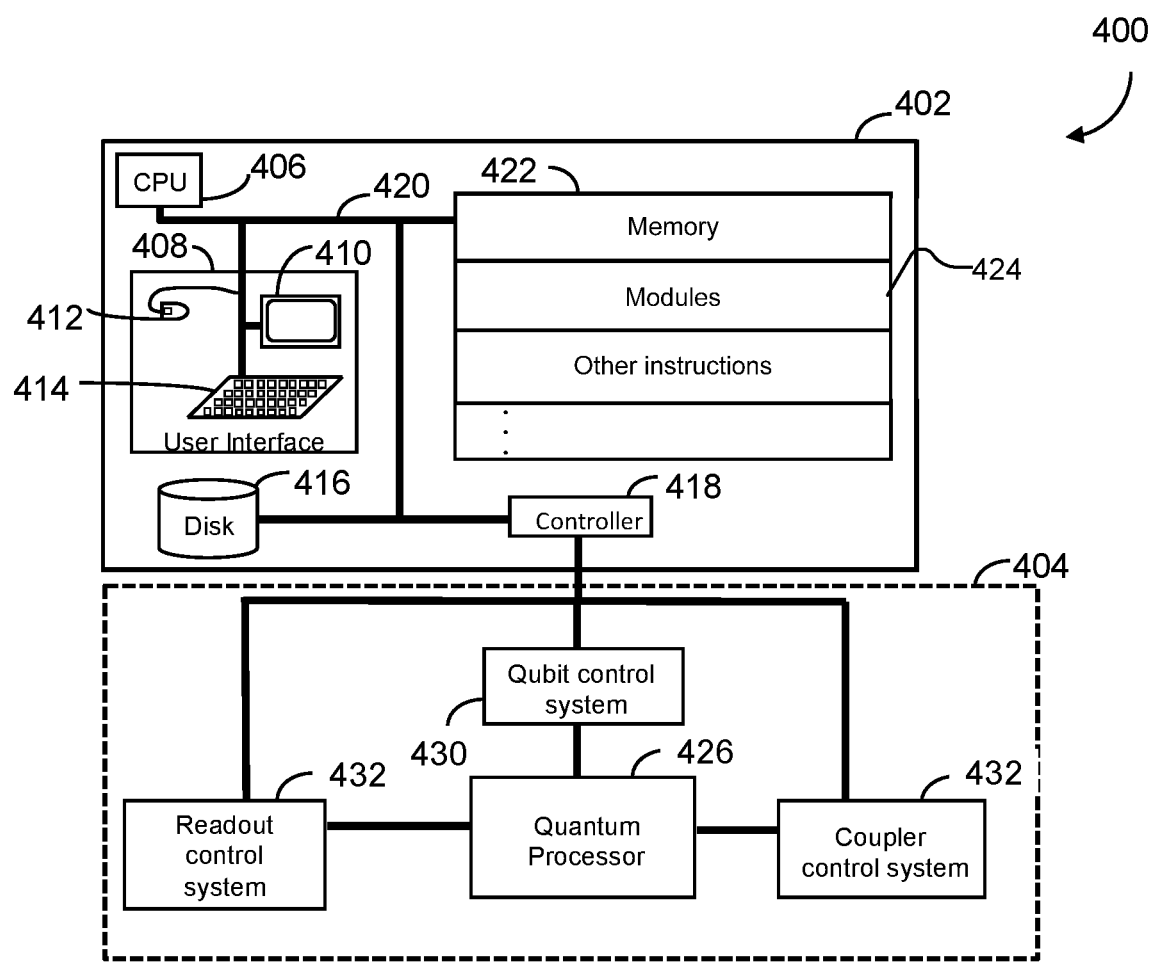
FIG. 4 is a schematic diagram illustrating a computing system comprising a digital computer and an analog computer that includes a superconducting integrated circuit, in accordance with the present systems and methods.

FIG. 4 illustrates a computing system 400 comprising a digital computer 402. The example digital computer 402 includes one or more digital processors 406 that may be used to perform classical digital processing tasks. Digital computer 402 may further include at least one system memory 422, and at least one system bus 420 that couples various system components, including system memory 422 to digital processor(s) 406. System memory 422 may store a set of modules 424.

The digital processor(s) 406 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 400 comprises an analog computer 404, which may include one or more quantum processors 426. Quantum processor 426 may be at least one superconducting integrated circuit that includes flux-susceptible superconducting devices and has been fabricated using systems and methods described in the present application to advantageously trap flux during cooling. Quantum processor 426 may include at least one integrated circuit that is fabricated using methods as described in greater detail herein. Digital computer 402 may communicate with analog computer 404 via, for instance, a controller 418. Certain computations may be performed by analog computer 404 at the instruction of digital computer 402, as described in greater detail herein.

Digital computer 402 may include a user input/output subsystem 408. In some implementations, the user input/output subsystem includes one or more user input/output components such as a display 410, mouse 412, and/or keyboard 414.

System bus 420 may employ any known bus structures or architectures, including a memory bus with a memory controller, a peripheral bus, and a local bus. System memory 422 may include non-volatile memory, such as read-only memory ("ROM"), static random-access memory ("SRAM"), Flash NAND; and volatile memory such as random-access memory ("RAM") (not shown).

Digital computer 402 may also include other non-transitory computer- or processor-readable storage media or non-volatile memory 416. Non-volatile memory 416 may take a variety of forms, including: a hard disk drive for reading from and writing to a hard disk (for example, a magnetic disk), an optical disk drive for reading from and writing to removable optical disks, and/or a solid state drive (SSD) for reading from and writing to solid state media (for example NAND-based Flash memory). Non-volatile memory 416 may communicate with digital processor(s) via system bus 420 and may include appropriate interfaces or controllers 418 coupled to system bus 420. Non-volatile memory 416 may serve as long-term storage for processor- or computer-readable instructions, data structures, or other data (sometimes called program modules) for digital computer 402.

Although digital computer 402 has been described as employing hard disks, optical disks and/or solid-state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory may be cached to non-volatile memory. Or a solid-state disk that employs integrated circuits to provide non-volatile memory.

Various processor- or computer-readable instructions, data structures, or other data may be stored in system memory 422. For example, system memory 422 may store instruction for communicating with remote clients and scheduling use of resources including resources on the digital computer 402 and analog computer 404. Also, for example, system memory 422 may store at least one of processor executable instructions or data that, when executed by at least one processor, causes the at least one processor to execute the various algorithms to execute instructions. In some implementations system memory 422 may store processor- or computer-readable calculation instructions and/or data to perform pre-processing, co-processing, and post-processing to analog computer 404. System memory 422 may store a set of analog computer interface instructions to interact with analog computer 404.

Analog computer 404 may include at least one analog processor such as quantum processor 426. Analog computer 404 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 404 may include programmable elements such as qubits, couplers, and other devices. Qubits may be read out via readout system 428. Readout results may be sent to other computer- or processor-readable instructions of digital computer 402. Qubits may be controlled via a qubit control system 430. Qubit control system 430 may include on-chip DACs and analog lines that are operable to apply a bias to a target device. Couplers that couple qubits may be controlled via a coupler control system 432. Couple control system 432 may include tuning elements such as on-chip DACs and analog lines. Qubit control system 430 and coupler control system 432 may be used to implement a quantum annealing schedule as described herein on analog processor 404. Programmable elements may be included in quantum processor 426 in the form of an integrated circuit. Qubits and couplers may be positioned in layers of the integrated circuit that comprise a first material. Other devices, such as readout control system 432, may be positioned in other layers of the integrated circuit that comprise a second material.

FIG. 5 is a flow chart illustrating a method 500 for fabricating a portion of a superconducting integrated circuit including mitigating flux trapping, in accordance with the present systems and methods. Method 500 includes acts 502-506, although in other implementations, certain acts may be omitted, additional acts may be added, and/or the acts may be performed in different orders. Method 500 may be performed by, for example, integrated circuit fabrication equipment in response to an initiation of a fabrication process.

At 502, a first metal layer is formed within the superconducting integrated circuit using a first superconducting material having a first critical temperature $T_{C1}$. A first device is formed within the first metal layer. The first device may be a flux-susceptible superconducting device, such as a qubit or a coupler.

A second metal layer may be formed adjacent to the first metal layer, the second metal layer having a shielding structure that shields the first device in the first metal layer, and governs, at least in part, flux-trapping behavior of the first metal layer. The second metal layer may be formed from the same material as the first metal layer, or a different material having a third critical temperature $T_{C3}$.

At 504, a flux-directing layer is formed using a superconducting material having a second critical temperature $T_{C2}$. The material of the flux-directing layer may be selected to provide favorable flux-trapping behavior during cooling.

At 506, a flux-trapping aperture may be formed at the flux-trapping location. Flux-trapping aperture may, in some implementations, be a parallel-piped opening or a trough having shielded walls. The flux-directing layer is positioned in flux-transmitting communication with an aperture location, with the aperture location being spaced apart from the first device at a position where trapped flux may be isolated from the first device. As used herein, flux-transmitting communication refers to sufficient physical proximity and arrangement that flux may be transmitted from the flux-directing layer to the flux-trapping location, although it will be understood that the flux-directing layer and the flux-trapping location may not be in contact and may not be mutually immediately adjacent. The aperture location may be formed within a portion of the flux-directing layer, or in a separate component of the superconducting integrated circuit. The flux-directing layer may be formed with flux-trapping structures, for example one or more moats, overlying at least a portion of the aperture location.

In performing 502 and 504 above, the first superconducting material and the second superconducting material are selected such that as the superconducting integrated circuit is cooled from a first temperature that is above both the first critical temperature and the second critical temperature ($T_1 > T_{C1}$, $T_{C2}$) to a second temperature that is less than both the first critical temperature and the second critical temperature ($T_2 < T_{C1}$, $T_{C2}$) (e.g., by a cryogenic refrigerator) a relative temperature difference between the first critical temperature and the second critical temperature causes the flux-directing layer to direct flux away from the first device and trap flux at the flux-trapping location as the superconducting integrated circuit is cooled.

Where a shielding layer is provided, the second superconducting material may be provided with a relative temperature difference between the second critical temperature and the third critical temperature to direct flux away from the first device and into the flux-directing layer and thereby the flux-trapping location.

As discussed above, depending on the structure of the superconducting integrated circuit, it may be beneficial either for the first metal layer to cool through its critical temperature first, or for the flux-directing layer to cool through its critical temperature first.

Where the flux-directing layer is part of the integrated circuit structure, it may be beneficial to have the flux directing layer have the lowest critical temperature within the superconducting integrated circuit, such that it is the last to transition during cooling. The first metal layer may either overlie a portion of the flux-directing layer, or the flux-directing layer may overlie the first metal layer.

Where the flux directing layer is provided as a separate shielding structure above the first metal layer, it may be beneficial to have the flux-directing layer have the highest critical temperature within the superconducting integrated circuit, such that it is the first to transition during cooling.

In some implementations it may be beneficial to have layers that do not contain flux sensitive devices transition first, acting as flux-directing layers and directing flux into a safe aperture to contain the flux. This may allow for the layers that contain flux sensitive devices to transition in an environment free of flux.

Forming the superconducting integrated circuit may additionally involve providing one or more additional superconducting metal layers either overlying the flux-directing layer or underlying the flux-directing layer. In some implementations, the superconducting metal layers may have decreasing critical temperature values from the upper layer to the lower layer, and the flux-directing layer may be the lower layer and may be adjacent to the substrate.

Shielding may be formed to enclose the flux-trapping location, and the shielding may be formed by a plurality of superconducting stud vias deposited within the superconducting integrated circuit. The flux-trapping location may be an aperture, which may be created by forming a box-shaped or parallel-piped shaped cavity or a trough within the superconducting integrated circuit at the aperture location. The aperture location may be selected to be a location that contains a second device such as a DAC, magnetometer, or other device that is less flux-susceptible.

Figure 6:
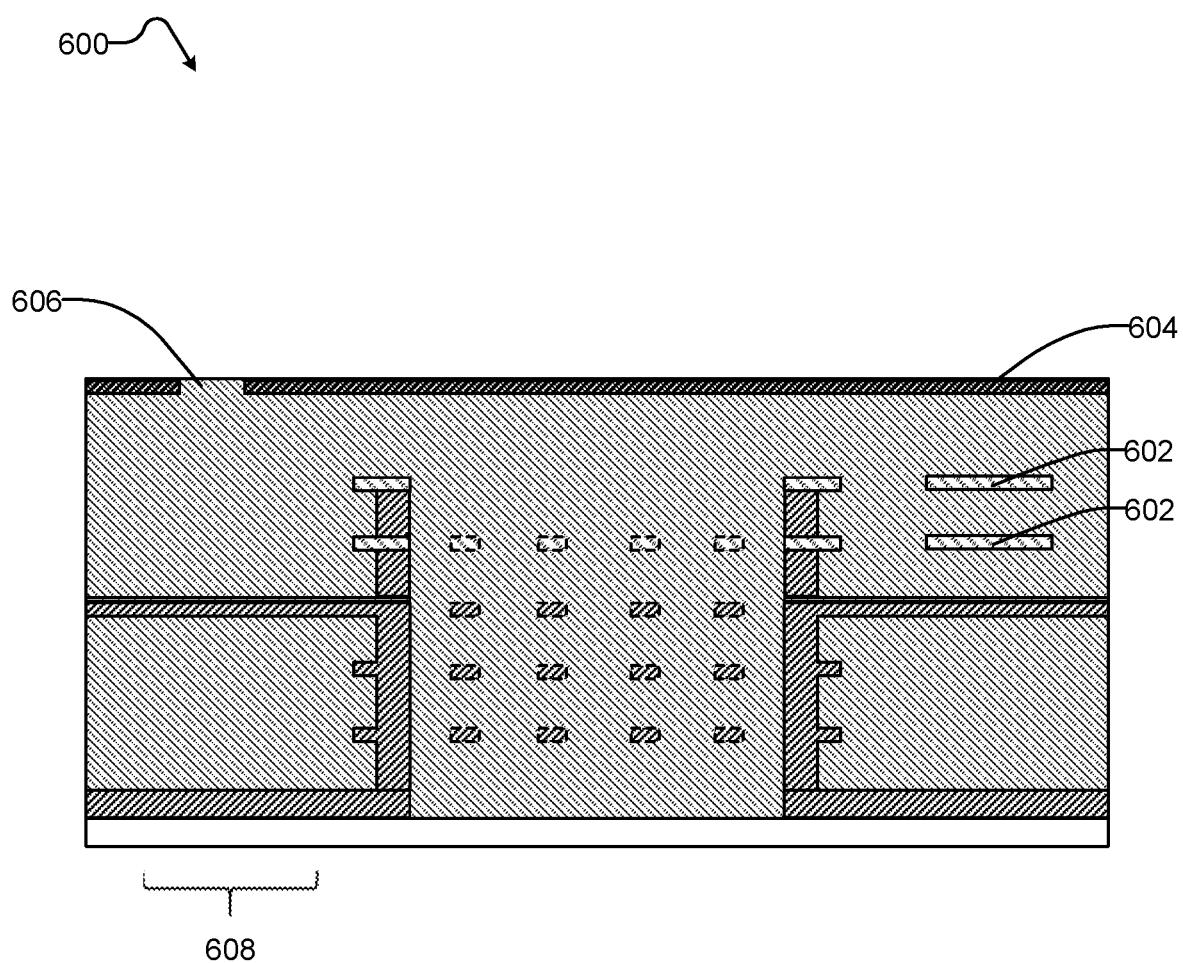
FIG. 6 is a sectional view of a portion of a superconducting integrated circuit having multiple superconducting materials.

In the example implementation of FIG. 6, superconducting integrated circuit 600 has one or more flux-susceptible superconducting devices 602 and a flux-directing layer 604. As discussed above, the superconducting integrated circuit, and in particular flux-directing layer 604, may be provided with non-superconducting regions 606 that act as preferred places to trap flux, referred to herein as moats. As discussed above, moats may be placed near devices that are not flux-susceptible, such as digital to analog converters (DACs) and/or magnetometers, or they may be placed in regions that are sufficiently far from any flux-susceptible elements that any coupling to flux trapped in moat 606 will be sufficiently weak as to not affect the operation of the flux-susceptible devices 602, such as region 608 in FIG. 6. It will be understood that any number of moats 606 may be included in the circuit to ensure sufficient flux trapping away from flux-susceptible devices 602.

In some implementations, the addition of moats in a superconducting material may reduce the circuit density of components, as the moats must be spaced sufficiently distanced from flux-susceptible devices to prevent their operation being negatively influenced by coupling to the trapped flux. Flux trapped in high kinetic inductance material may have a smaller coupling to surrounding structures and may therefore be placed closer to flux-susceptible devices without having a negative impact on those devices. As discussed above, a high kinetic inductance material may be defined as a material where at least 10% of the energy is stored as kinetic inductance, or where the kinetic inductance fraction is $0.1 < \alpha \leq 1$. The fluxoid quantization condition is given by:

$$(L_k + L_g)I_s - \Phi_a = n\Phi_0$$

Where $L_k$ is the kinetic inductance of the moat material, $L_g$ is the geometric inductance of the moat material, $I_s$ is the screening current, $\Phi_a$ is the external flux (that may be applied to the flux-susceptible device), n is an integer, and $\Phi_0$ is the magnetic flux quantum. For the same values of n, $\Phi_a$, and $L_g$, a moat formed in a higher kinetic inductance material will have a smaller screening current. This smaller screening current may result in smaller flux coupling to surrounding structures.

High kinetic inductance materials, as defined above, may have a higher critical temperature than the superconducting materials (such as Nb or Al) used for the superconducting devices in superconducting integrated circuit 600. In some implementations, flux-directing layer 604 is formed of a high kinetic inductance material and passes through its $T_c$ prior to all of the other layers of superconducting integrated circuit 600, directing flux into moat (or moats) 606 such that the ambient magnetic flux will be trapped in region 608 sufficiently far from flux-susceptible devices 602 so as to not affect the operation of flux-susceptible devices 602.

FIGS. 7A, 7B, and 7C are each a sectional view of a portion of a superconducting integrated circuit 700a, 700b, 700c, where like numbers indicate similar components. Superconducting integrated circuits 700a, 700b, and 700c have first and second flux-susceptible devices 702 positioned on different layers. As shown, flux-susceptible devices 702 are trilayer Josephson junctions that may form part of the wiring for a qubit or coupler. It will be understood that any flux-susceptible device may be included. Superconducting integrated circuit 700a has a flux-directing layer 704 in the form of a ground plane, while circuit 700b has a flux-directing layer 704 in the form of a shielding layer within the stack, and circuit 700c has a flux-directing layer 704 in the form of a sky shield. In each case, flux-directing layer 704 has a moat 706 in a flux trapping location 708. It will be understood that more than one moat 706 may be provided, and that moats may be placed in a variety of locations within a superconducting integrated circuit to control flux trapping throughout the circuit. The material of flux-directing layer 704 is selected such that the flux-directing layer 704 has a $T_c$ that results in a favorable movement of flux through the circuit during cooling of superconducting integrated circuit 700a. In some implementations, flux-directing layer 704 may be selected to be a material with a low $T_c$ such that the flux-directing layer 704 transitions last during cooling and thereby controls the movement of the flux expelled from the other layers. In other implementations, flux-directing layer 704 may be selected to be a material with a middle $T_c$ such that the flux-directing layer 704 transitions after some layers of the circuit, but before flux-susceptible devices 702, in order to prevent flux trapping near these devices. In other implementations, flux-directing layer 704 may be selected to be a material with a high $T_c$ such that the flux-directing layer 704 transitions prior to any other layers of the circuit and shifts the magnetic flux away from flux-susceptible devices 702 to a flux trapping location 708 prior to flux-susceptible devices 702 becoming superconducting.

The selection of the $T_c$ of flux-directing layer 704 may be done through material choice, or through treatments applied to that material. In some implementations, the material may be selected based on its kinetic inductance. In many cases, a material with a higher $T_c$ also has a higher kinetic inductance. Higher kinetic inductance material may have smaller flux coupling of any flux contained within a moat in the higher kinetic inductance material to surrounding structures. This may allow for increased circuit density, as moats do not need to be spaced as far from flux-susceptible devices.

FIG. 8 is a top view of a representative superconducting circuit 800 having one or more flux-susceptible superconducting devices 802a, 802b (collectively 802) and a flux-directing layer 804. As shown, flux-susceptible superconducting devices 802 include qubits 802a and coupler 802b. It will be understood that these are representative structures only, and that the structure of flux-susceptible superconducting devices 802 may vary. Superconducting circuit 800 has a moat 806 spaced from flux-susceptible superconducting devices 802 in the form of a long narrow channel. As discussed above, moats may take other forms, such as a spiral to increase surface area. Opening 808 is shown in broken lines for clarity, and it will be understood that while flux-directing layer 804 may have an opening to accommodate flux-susceptible devices 802, flux-directing layer 804 may be continuous above or below flux-susceptible devices 802. It may be beneficial to have flux-directing layer 804 be continuous or nearly continuous across superconducting circuit 800, with the exception of the location of moats 806, as the large area of superconducting material may allow for improved control over flux trapping and help to ensure that flux is directed into moats 806.

The above described method(s), process(es), or technique(s) could be implemented by a series of processor readable instructions stored on one or more non-transitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) may be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications may be made without departing from the spirit and scope of the disclosure, as will be recognized by those skilled in the relevant art. The teachings provided herein of the various implementations may be applied to other methods of quantum computation, not necessarily the exemplary methods for quantum computation generally described above.

The various implementations described above may be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 8,441,330; 8,247,799; 7,687,938; U.S. Provisional Patent Application No. 62/760,253; U.S. Provisional Patent Application No. 62/944,143; and U.S. Non-Provisional patent application Ser. No. 16/481,788.

These and other changes may be made to the implementations in light of the above-detailed description. In general, in the following claims, the terms used should not be construed to limit the claims to the specific implementations disclosed in the specification and the claims but should be construed to include all possible implementations along with the full scope of equivalents to which such claims are entitled. Accordingly, the claims are not limited by the disclosure.

The invention claimed is:

1. A superconducting integrated circuit comprising:
a first device, the first device comprising at least a portion of a first metal layer within the superconducting integrated circuit, the first metal layer comprising a first superconducting material having a first critical temperature;
a flux-trapping location spaced from the first device, the flux-trapping location positioned such that flux trapped within the flux-trapping location is isolated from the first device; and
a flux-directing layer comprising a superconducting material having a second critical temperature, the flux-directing layer positioned in communication with the flux-trapping location;
wherein the first critical temperature and the second critical temperature have a relative temperature difference, such that as the superconducting integrated circuit is cooled to a temperature that is less than both the first critical temperature and the second critical temperature, the flux is directed away from the first device and into the flux-directing layer, and the flux-directing layer directs and traps the flux within the flux-trapping location.

2. The superconducting integrated circuit of claim 1, further comprising a flux-trapping aperture at the flux-trapping location, wherein the flux-directing layer comprises an opening aligned with the flux-trapping aperture.

3. The superconducting integrated circuit of claim 2, wherein the flux-trapping aperture comprises one of a parallel-piped opening and a trough positioned within the superconducting integrated circuit.

4. The superconducting integrated circuit of claim 1, further comprising shielding that encloses the flux-trapping location.

5. The superconducting integrated circuit of claim 4, wherein the shielding comprises a plurality of superconducting stud vias.

6. The superconducting integrated circuit of claim 1, wherein the first device comprises one of a qubit and a coupler.

7. The superconducting integrated circuit of claim 1, wherein the first metal layer overlies at least a portion of the flux-directing layer, and wherein the first critical temperature is greater than the second critical temperature.

8. The superconducting integrated circuit of claim 7, further comprising one or more additional metal layers overlying at least a portion of the flux-directing layer, at least one of the one or more additional metal layers overlying the first metal layer and at least one of the one or more additional metal layers underlying the first metal layer, a critical temperature of each additional metal layer being greater than the second critical temperature, wherein the critical temperatures of the first metal layer, the one or more additional metal layers, and the flux-directing layer increase incrementally by layer from the flux-directing layer to an uppermost layer, wherein the uppermost layer is one of the one or more additional metal layers overlying all other ones of the one or more additional metal layers and the first metal layer.

9. The superconducting integrated circuit of claim 1, further comprising a second metal layer positioned adjacent to the first metal layer, the second metal layer comprising a shielding structure that shields the first device, the second metal layer comprising a superconducting material having a third critical temperature, wherein a relative temperature difference between the second critical temperature and the third critical temperature is selected to direct the flux away from the first device and into the flux-trapping location.

10. The superconducting integrated circuit of claim 9, wherein the first metal layer overlies at least a portion of the flux-directing layer, and wherein the second critical temperature is less than the third critical temperature.

11. The superconducting integrated circuit of claim 1, wherein the flux-directing layer overlies at least a portion of the first metal layer.

12. The superconducting integrated circuit of claim 11, further comprising a second metal layer, the first metal layer overlying at least a portion of the second metal layer, the second metal layer comprising a shielding structure that shields the first device, the second metal layer comprising a superconducting material having a third critical temperature, and further comprising forming a base metal layer, the second metal layer overlying the base metal layer, the third critical temperature being greater than a critical temperature of the base metal layer, and the critical temperature of the base metal layer being greater than the second critical temperature.

13. The superconducting integrated circuit of claim 11, wherein the flux-directing layer comprises flux-trapping structures overlying at least a portion of the flux-trapping location.

14. The superconducting integrated circuit of claim 1, wherein the flux-directing layer comprises high kinetic inductance material.

15. The superconducting integrated circuit of claim 11, wherein the first critical temperature is less than the second critical temperature.

16. The superconducting integrated circuit of claim 1, wherein the flux-trapping location contains a second device, and the second device is a digital to analog converter.

17. The superconducting integrated circuit of claim 13, wherein flux-trapping structures include at least one moat.

18. The superconducting integrated circuit of claim 14, wherein at least 10% of energy stored in the high kinetic inductance material is stored as kinetic inductance.

19. The superconducting integrated circuit of claim 14, wherein a kinetic inductance fraction of the high kinetic inductance material is $0.1 < \alpha \leq 1$.

20. The superconducting integrated circuit of claim 1, wherein the flux-directing layer comprises at least one moat.

* * * * *